(12) United States Patent  
Inaba et al.

(10) Patent No.: US 9,154,109 B2  
(45) Date of Patent: Oct. 6, 2015

(54) VIBRATOR, OSCILLATOR, ELECTRONIC APPARATUS, MOVING OBJECT, AND METHOD OF MANUFACTURING VIBRATOR

(71) Applicant: Seiko Epson Corporation, Tokyo (JP)

(72) Inventors: Shogo Inaba, Shiojiri (JP); Akinori Yamada, Ina (JP); Aritsugu Yajima, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/132,475

(22) Filed: Dec. 18, 2013

(65) Prior Publication Data

US 2014/0184018 A1 Jul. 3, 2014

(30) Foreign Application Priority Data

Dec. 27, 2012 (JP) ................................. 2012-284481  
Mar. 25, 2013 (JP) ................................. 2013-061554

(51) Int. Cl.
*H03H 9/00* (2006.01)
*H03H 9/24* (2006.01)
*H03H 3/007* (2006.01)

(52) U.S. Cl.
CPC ........... *H03H 9/2405* (2013.01); *H03H 3/0072* (2013.01); *Y10T 29/49117* (2015.01)

(58) Field of Classification Search
CPC .................. H03H 2009/02496; H03H 3/0072; H03H 9/2463; H03H 2009/02511; H03H 9/02259
USPC ........................... 333/186, 197; 310/300, 309
See application file for complete search history.

(56) References Cited

U.S. PATENT DOCUMENTS

| | | |
|---|---|---|
| 6,930,569 B2 | 8/2005 | Hsu |
| 8,212,324 B2 * | 7/2012 | Caruyer et al. ............... 257/415 |
| 8,669,823 B1 * | 3/2014 | Olsson et al. ................. 331/154 |
| 2003/0184413 A1 | 10/2003 | Nguyen |
| 2011/0024812 A1 * | 2/2011 | Weinstein et al. ............ 257/296 |
| 2014/0145552 A1 * | 5/2014 | Kihara et al. ................. 310/300 |

FOREIGN PATENT DOCUMENTS

JP 2004-515089 A 5/2004

* cited by examiner

*Primary Examiner* — Quan Tra  
(74) *Attorney, Agent, or Firm* — Harness, Dickey & Pierce, P.L.C.

(57) ABSTRACT

An MEMS vibrator includes a substrate, a fixation section disposed above a principal surface of the substrate, a support section extending from the fixation section, and a vibrating body (an upper electrode) separated from the substrate and supported by the support section in a node part of a vibration, and the vibrating body is a 2n-fold rotationally symmetric body having 2n beams radially extending from a node part of a vibration, wherein n is a natural number.

7 Claims, 16 Drawing Sheets

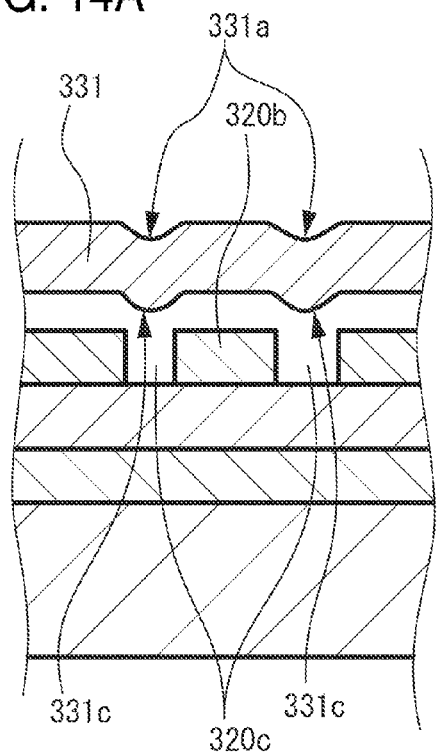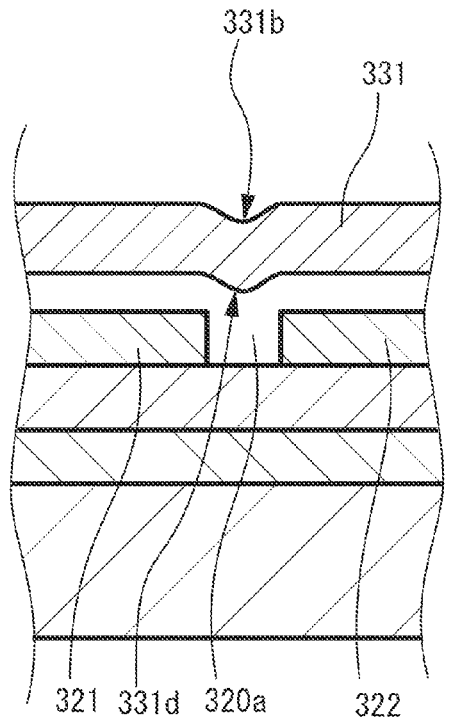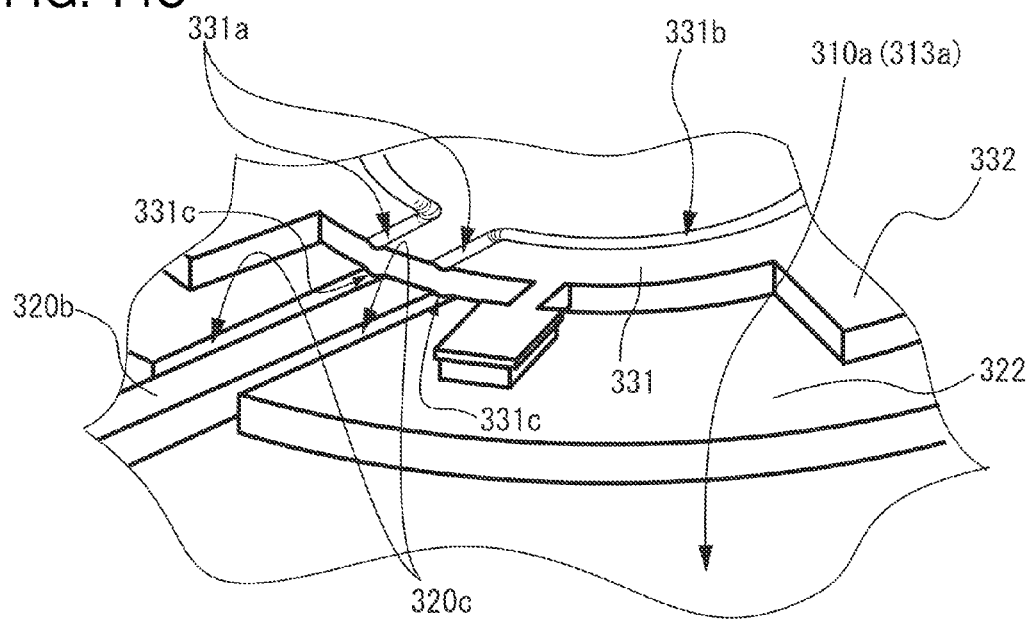

VIBRATOR, OSCILLATOR, ELECTRONIC APPARATUS, MOVING OBJECT, AND METHOD OF MANUFACTURING VIBRATOR

BACKGROUND

1. Technical Field

The invention relates to a vibrator, an oscillator, an electronic apparatus, a moving object, and a method of manufacturing a vibrator.

2. Related Art

In general, there are known electromechanical structures (e.g., a vibrator, a filter, a sensor, and an electric motor) provided with a mechanically movable structure called a micro electro mechanical system (MEMS) device formed using the semiconductor microfabrication technology. Among these examples, the MEMS vibrator is easy to manufacture so as to incorporate a semiconductor circuit, and is advantageous to miniaturization and sophistication compared to a vibrator and a resonator using an existing quartz crystal or dielectric body, and therefore the application range of the MEMS vibrator has been broadened.

As a representative example of MEMS vibrator of related art, there are known a comb-shaped vibrator and a beam-type vibrator, wherein the comb-shaped vibrator vibrates in a direction parallel to a surface of a substrate on which the vibrator is disposed, and the beam-type vibrator vibrates in a thickness direction of the substrate. The beam-type vibrator is a vibrator including a stationary electrode formed on the substrate, a movable electrode disposed so as to be separated from the substrate, and so on, and a clamped-free beam, a clamped-clamped beam, a free-free beam, and so on are known due to the way for supporting the movable electrode.

Since the free-free beam MEMS vibrator is supported by a support member at a part of the movable electrode thus vibrating, the part corresponding to a node of the vibration, a vibration leakage to the substrate is small, and the efficiency of the vibration is high. In the specification of U.S. Pat. No. 6,930,569 B2 (Document 1), there is proposed a technology of setting the length of the support member to a length appropriate to the frequency of the vibration to thereby improve the vibration characteristics.

Further, in JP-T-2004-515089 (Document 2), there is described a signal processing method asserted to be able to process the signal with low power consumption using a plurality of MEMS vibrators (vibrating micro-mechanical elements).

However, the MEMS vibrators described in Document 1 and Document 2 have a problem that it becomes difficult to obtain stable vibration characteristics or the desired vibration characteristics in the case of achieving further miniaturization. In the specific explanation, in a method of manufacturing a beam-type vibrator using the MEMS technology, there is generally adopted a method of stacking a sacrifice layer such as an oxide film as an upper layer of the stationary electrode formed on the substrate, and then removing the sacrifice layer after forming the movable electrode as an upper layer of the sacrifice layer to thereby separate the movable electrode from the substrate and the stationary electrode. Therefore, the movable electrode stacked as the upper layer part tends to have a shape reflecting the uneven shape of the lower layer part. For example, in the MEMS vibrator shown in FIG. 2 of Document 1 and the MEMS vibrator shown in FIG. 5a of Document 2 (partially extracted in accompanying FIGS. 2A and 2B), the pattern shape of the stationary electrode disposed in the lower layer appears as unevenness of the movable electrode in the upper layer. Such unevenness of the movable electrode exerts an influence on the stiffness of the movable electrode as a vibrating beam. Therefore, in the case of achieving further miniaturization of the vibrator, the influence becomes significant, and has caused a problem that it is unachievable to obtain the stable vibration characteristics and the desired vibration characteristics. More specifically, for example, even if the movable electrode (a vibrating beam) is disposed in a balanced manner in the plan view of the vibrator, since the unevenness of the pattern disposed in the lower layer is reflected, there is a case in which the uneven shape of the vibrating beam is off-balance in a side view. In this case, since the distribution of the stiffness in the vibrating beam is uneven, the balance of the vibration of the vibrating beam is lost, which leads the problem that the vibration efficiency is degraded, or the vibration leakage to the outside through the support section increases, as a result. Further, since the vibrating beam has such a complicated shape, there has been a problem that the vibration design in the case of manufacturing the vibrator becomes complicated.

SUMMARY

An advantage of some aspects of the invention is to solve at least a part of the problems described above, and the invention can be implemented as the following application examples or aspects.

Application Example 1

This application example is directed to a vibrator including a substrate, a fixation section disposed on a principal surface of the substrate, a support section extending from the fixation section, and a vibrating body separated from the substrate and supported by the support section in a node part of a vibration, wherein the vibrating body is a 2n-fold rotationally symmetric body having 2n beams extending from the node part of the vibration, wherein n is a natural number.

According to this application example, the vibrating body is connected to the support section in the node part of the vibration, and the shape of the vibrating body presents the shape of the 2n-fold rotationally symmetric body having the 2n beams radially extending from the node part of the vibration. In other words, the 2n beams radially extending from the node part of the vibration have similar shapes to each other, and are arranged at regular intervals forming a rotationally symmetric body. Further, in the case of, for example, configuring the vibrator as the beam-type vibrator vibrating in the thickness direction of the substrate, since the vibration of the overall vibrating body is balanced out in the node part of the vibration by setting the phases of the vibrations of the respective beams adjacent to each other to be opposite to each other, the vibration leakage from the node part of the vibration supported by the support section can be suppressed. This applies similarly to a comb-shaped vibrator vibrating in a direction parallel to the substrate surface, and the vibration leakage from the node part of the vibration supported by the support section can be suppressed.

Therefore, according to this application example, even in the case of enhancing the miniaturization, it is possible to provide a vibrator, the vibration efficiency of which is inhibited from degrading, and the vibration leakage in which is suppressed.

Application Example 2

This application example is directed to a vibrator including a substrate, a lower electrode disposed on a principal surface of the substrate, a fixation section disposed on the principal surface of the substrate, a support section extending from the fixation section, and an upper electrode supported by the support section so as to be separated from the substrate, wherein the upper electrode is a vibrating body having an area overlapping the lower electrode in a plan view of the substrate, the support section supports a node part of a vibration provided to the upper electrode as the vibrating body, and the upper electrode is a 2n-fold rotationally symmetric body having 2n beams radially extending from the node part of the vibration, wherein n is a natural number.

According to this application example, the upper electrode as the vibrating body is supported by the support section in the node part of the vibration, and the shape of the vibrating body presents the shape of the 2n-fold rotationally symmetric body having the 2n beams radially extending from the node part of the vibration. In other words, the 2n beams radially extending from the node part of the vibration have similar shapes to each other, and are arranged at regular intervals forming a rotationally symmetric body. Further, the upper electrode as the vibrating body has an area overlapping the lower electrode disposed on the principal surface of the substrate in the plan view of the substrate. Therefore, the vibrator can be configured as the electrostatic beam-type vibrator vibrating in the thickness direction of the substrate due to the alternating-current voltage applied between the lower electrode and the upper electrode. Further, in this configuration, since the vibration of the overall vibrating body is balanced out in the node part of the vibration by, for example, setting the phases of the vibrations of the respective beams adjacent to each other to be opposite to each other, the vibration leakage from the node part of the vibration supported by the support section can be suppressed.

Therefore, according to this application example, even in the case of enhancing the miniaturization, it is possible to provide a vibrator, the vibration efficiency of which is inhibited from degrading, and the vibration leakage in which is suppressed.

Application Example 3

This application example is directed to the vibrator according to the application example described above, wherein an area of the lower electrode overlapping the upper electrode in the plan view of the substrate has a shape of a 2n-fold rotationally symmetric body.

According to this application example, the area of the lower electrode overlapping the upper electrode in the plan view of the substrate has a shape of a 2n-fold rotationally symmetric body. By adopting such a configuration, it is possible to provide an electrostatic beam-type vibrator, which is more simply and conveniently manufactured, which is higher in vibration efficiency, and the vibration leakage in which is further suppressed. In the specific explanation, in the case of, for example, stacking the sacrifice layer on the lower electrode, and then forming the upper electrode so as to be stacked on the sacrifice layer in the manufacturing process of the vibrator, since the area of the lower electrode, which overlaps the upper electrode in the plan view, has the shape of the 2n-fold rotationally symmetric body, it is also possible to more easily form the uneven shape of the upper electrode, on which the unevenness of the area of the lower electrode is reflected, to have the shape of the 2n-fold rotationally symmetric body. As a result, as described above, since the vibration of the overall vibrating body is balanced out in the node part of the vibration, it is possible to more easily and conveniently provide the electrostatic beam-type vibrator, which is higher in vibration efficiency, and the vibration leakage in which is suppressed.

Application Example 4

This application example is directed to the vibrator according to the application example described above, wherein the lower electrode has a dummy slit so that the area of the lower electrode overlapping the upper electrode in the plan view of the substrate has a shape of the 2n-fold rotationally symmetric body.

According to this application example, the lower electrode is provided with the dummy slit so that the area of the lower electrode overlapping the upper electrode in the plan view of the substrate has a shape of a 2n-fold rotationally symmetric body. By adopting such a configuration, it is possible to provide an electrostatic beam-type vibrator, which is more simply and conveniently manufactured, which is higher in vibration efficiency, and the vibration leakage in which is further suppressed. In the specific explanation, the lower electrode may be formed of the electrically isolated pattern in the area overlapping the upper electrode in some cases. In the isolation section, since the lower electrode is separated, the uneven shape is formed. On the other hand, by forming the dummy slit even in the part, which does not need to electrically be separated, as in the case of this application example, it is possible to form the area of the lower electrode overlapping the upper electrode so as to have the shape of the 2n-fold rotationally symmetric body. The lower electrode electrically isolated by the dummy slit can electrically be connected to each other by achieving the connection in the area not overlapping the upper electrode in the plan view. By adopting such a configuration, in the case of, for example, stacking the sacrifice layer on the lower electrode, and then forming the upper electrode so as to be stacked on the sacrifice layer in the manufacturing process of the vibrator, since the area of the lower electrode, which overlaps the upper electrode in the plan view, has the shape of the 2n-fold rotationally symmetric body, it is also possible to easily form the uneven shape of the upper electrode, on which the unevenness of the area of the lower electrode is reflected, to have the shape of the 2n-fold rotationally symmetric body. As a result, as described above, since the vibration of the overall vibrating body is balanced out in the node part of the vibration, it is possible to more easily and conveniently provide the electrostatic beam-type vibrator, which is higher in vibration efficiency, and the vibration leakage in which is suppressed.

Application Example 5

This application example is directed to a method of manufacturing a vibrator including: stacking a first conductive material layer on a principal surface of a substrate, shaping the first conductive material layer to form a lower electrode, stacking a sacrifice layer so as to overlap the lower electrode, shaping the sacrifice layer to form an opening section adapted to expose at least a part of the lower electrode, stacking a second conductive material layer so as to overlap the sacrifice layer and the opening section, shaping the second conductive material layer to form an upper electrode as a vibrating body having an area overlapping the lower electrode in a plan view of the substrate, a fixation section having an area overlapping the opening section, and a support section extending from the fixation section and connected to a central part of the upper electrode, and removing the sacrifice layer by etching, wherein in the shaping of the second conductive material layer, the upper electrode is formed to have a shape of a 2n-fold rotationally symmetric body having 2n beams extending from a central part of the upper electrode, wherein n is a natural number, and in the shaping of the first conductive material layer, the lower electrode is formed in advance so that an area of the lower electrode overlapping the upper electrode becomes a 2n-fold rotationally symmetric body in a plan view of the substrate after performing the shaping of the second conductive material layer.

According to the method of manufacturing a vibrator related to this application example, the upper electrode as the vibrating body is supported by the support section at the central part, and is formed to have the shape of the 2n-fold rotationally symmetric body having the 2n beams radially extending from the central part. In other words, the 2n beams radially extending from the central part have similar shapes to each other, and are arranged at regular intervals forming the rotationally symmetric body. Further, the upper electrode as the vibrating body is formed so as to have an area overlapping the lower electrode disposed on the principal surface of the substrate in the plan view of the substrate. Therefore, the vibrator obtained by this manufacturing method can be configured as the electrostatic beam-type vibrator vibrating in the thickness direction of the substrate due to the alternating-current voltage applied between the lower electrode and the upper electrode. Further, in this configuration, since the central part of the upper electrode supported by the support section is configured as the node part of the vibration, and the vibration of the overall vibrating body is balanced out in the node part of the vibration by, for example, setting the phases of the vibrations of the respective beams adjacent to each other to be opposite to each other, the vibration leakage from the node part of the vibration supported by the support section can be suppressed.

Therefore, according to this application example, even in the case of enhancing the miniaturization, it is possible to provide a vibrator, the vibration efficiency of which is inhibited from degrading, and the vibration leakage in which is suppressed.

Application Example 6

This application example is directed to a method of manufacturing a vibrator including: stacking a first conductive material layer on a principal surface of a substrate, shaping the first conductive material layer to form a lower electrode, stacking a first sacrifice layer so as to overlap the lower electrode, grinding to planarize the first sacrifice layer so that the lower electrode is exposed, stacking a second sacrifice layer so as to overlap the lower electrode planarized and a surface formed of the first sacrifice layer, shaping the second sacrifice layer to form an opening section adapted to expose at least a part of the lower electrode, stacking a second conductive material layer so as to overlap the second sacrifice layer and the opening section, shaping the second conductive material layer to form an upper electrode as a vibrating body having an area overlapping the lower electrode in a plan view of the substrate, a fixation section having an area overlapping the opening section, and a support section extending from the fixation section and connected to a central part of the upper electrode, and removing the first sacrifice layer and the second sacrifice layer by etching, wherein in the shaping of the second conductive material layer, the upper electrode is formed to have a shape of a 2n-fold rotationally symmetric body having 2n beams extending from a central part of the upper electrode, wherein n is a natural number.

According to the method of manufacturing a vibrator related to this application example, the first sacrifice layer stacked so as to cover the lower electrode is ground so that the lower electrode is exposed, and thus, there is formed a planarized surface formed of the lower electrode and the first sacrifice layer. The upper electrode is formed so as to be stacked on the second sacrifice layer, which is stacked on the surface thus planarized, and is therefore formed to have the shape with the unevenness suppressed without being affected by the lower electrode. Further, the upper electrode as the vibrating body is supported by the support section at the central part, and is formed to have the shape of the 2n-fold rotationally symmetric body having the 2n beams radially extending from the central part. In other words, the 2n beams radially extending from the central part have the respective shapes, which have the unevenness suppressed and are similar to each other, and are arranged at regular intervals forming the rotationally symmetric body. Further, the upper electrode as the vibrating body is formed so as to have an area overlapping the lower electrode disposed on the principal surface of the substrate in the plan view of the substrate. Therefore, the vibrator obtained by this manufacturing method can be configured as the electrostatic beam-type vibrator vibrating in the thickness direction of the substrate due to the alternating-current voltage applied between the lower electrode and the upper electrode. Further, in this configuration, since the central part of the upper electrode supported by the support section is configured as the node part of the vibration, and the vibration of the overall vibrating body is balanced out in the node part of the vibration by, for example, setting the phases of the vibrations of the respective beams adjacent to each other to be opposite to each other, the vibration leakage from the node part of the vibration supported by the support section can be suppressed.

Therefore, according to this application example, even in the case of enhancing the miniaturization, it is possible to provide a vibrator, the vibration efficiency of which is inhibited from degrading, and the vibration leakage in which is suppressed.

Application Example 7

This application example is directed to an oscillator including the vibrator according to the application example described above.

According to this application example, by making use of the vibrator, which has a higher vibration efficiency and is further miniaturized, as the oscillator, a higher-performance and miniaturized oscillator can be provided.

Application Example 8

This application example is directed to an electronic apparatus including the vibrator according to the application example described above.

According to this application example, by making use of the vibrator, which has a higher vibration efficiency and is further miniaturized, as the electronic apparatus, a higher-performance and miniaturized electronic apparatus can be provided.

Application Example 9

This application example is directed to a moving object including the vibrator according to the application example described above.

According to this application example, by making use of the vibrator, which has a higher vibration efficiency and is further miniaturized, as the moving object, a moving object, which is higher-performance and is superior in space utility, can be provided.

BRIEF DESCRIPTION OF THE DRAWINGS

The invention will be described with reference to the accompanying drawings, wherein like numbers reference like elements.

FIGS. 12A through 12C are diagrams showing the vibratory device equipped with the vibrator according to the modified example 1, wherein FIG. 12A is a cross-sectional view in the O-D section shown in FIG. 11, FIG. 12B is a cross-sectional view in the O-E section shown in FIG. 11, and FIG. 12C is a cross-sectional view in the O-F section shown in FIG. 11.

FIGS. 13A and 13B are diagrams for explaining an action of the vibrator in the vibratory device equipped with the vibrator according to the modified example 1, wherein FIG. 13A is a partial plan view and FIG. 13B is a cross-sectional view.

FIGS. 14A through 14C are diagrams showing the vibratory device equipped with the vibrator according to the modified example 1, wherein FIG. 14A is an enlarged cross-sectional view in the G-G' section shown in FIG. 11, and FIG. 14B is an enlarged cross-sectional view in the H-H' section shown in FIG. 11.

DESCRIPTION OF EXEMPLARY EMBODIMENTS

Some embodiments of the invention will hereinafter be explained with reference to the accompanying drawings. The following is one embodiment of the invention, and does not at all limit the invention. It should be noted that in each of the drawings described below, description with scales different from those in the actual configuration may be used in some cases for making the explanation easy to understand.

First Embodiment

Firstly, an MEMS vibrator 100 as a vibrator according to the first embodiment will be explained.

Figure 1A:
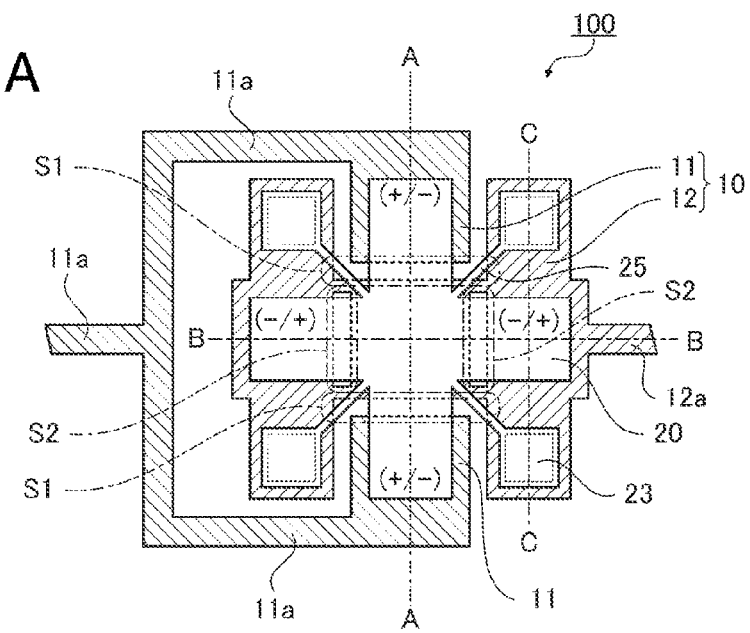
FIGS. 1A through 1D are a plan view and cross-sectional views of a vibrator according to a first embodiment of the invention.
Figure 1B:
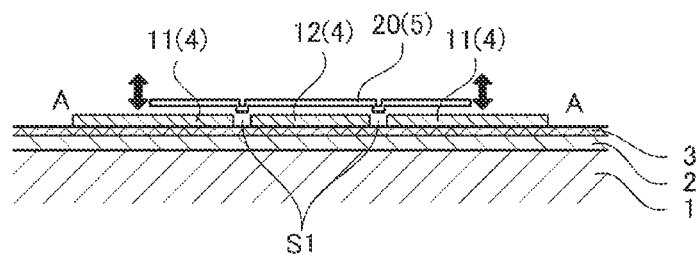
Figure 1C:
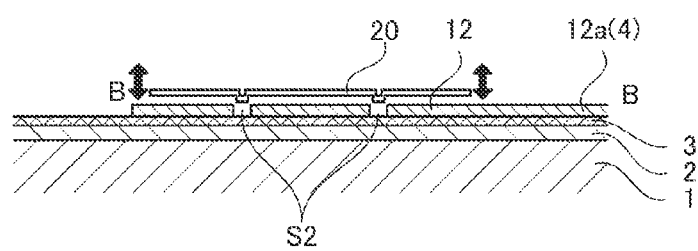
Figure 1D:
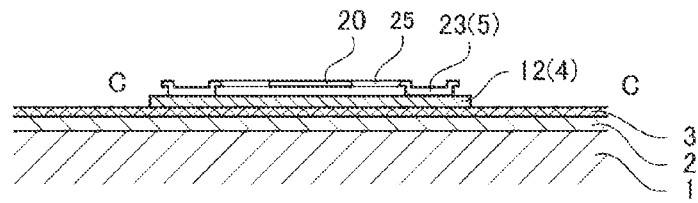

FIG. 1A is a plan view of the MEMS vibrator 100, FIG. 1B is an A-A cross-sectional view of FIG. 1A, FIG. 1C is a B-B cross-sectional view of FIG. 1A, and FIG. 1D is a C-C cross-sectional view of FIG. 1A.

The MEMS vibrator 100 is an electrostatic beam-type vibrator provided with a stationary electrode (a lower electrode) formed on the substrate, and a movable electrode (an upper electrode) formed separately from the substrate and the stationary electrode. The movable electrode is formed separately from the substrate and the stationary electrode by etching a sacrifice layer stacked on the principal surface of the substrate and the stationary electrode.

It should be noted that the sacrifice layer is a layer tentatively formed of an oxide film or the like, and is removed by etching after forming a necessary layer above, below, or the periphery of the sacrifice layer. By removing the sacrifice layer, a necessary space is formed with an upper, lower, or peripheral layer, or a necessary structure is formed separately.

The configuration of the MEMS vibrator 100 will hereinafter be explained. The method of manufacturing the MEMS vibrator 100 will be explained in the embodiment described later.

The MEMS vibrator 100 is configured including a substrate 1, lower electrodes 10 (a first lower electrode 11, a second lower electrode 12) and fixation sections 23 disposed on a principal surface of the substrate 1, support sections 25 respectively extending from the fixation sections 23, an upper electrode 20 as a movable electrode supported by the support sections 25 so as to be separated from the substrate 1, and so on.

A silicon substrate is used as a preferable example of the substrate 1. On the substrate 1, there are sequentially stacked an oxide film 2 and a nitride film 3, and the lower electrodes 10 (the first lower electrode 11, the second lower electrode 12), the upper electrode 20, the fixation sections 23, and the support sections 25, and so on are formed above the principal surface (the surface of the nitride film 3) of the substrate 1.

It should be noted that the explanation is presented here assuming that the direction of stacking the oxide film 2 and the nitride film 3 sequentially on the principal surface of the substrate 1 in the thickness direction of the substrate 1 is an upper direction.

Among the lower electrodes 10, the second lower electrode 12 is a stationary electrode for fixing the fixation sections 23 to the surface of the substrate 1, and applying an electrical potential to the upper electrode 20 via the fixation sections 23 and the support sections 25, and is formed to have an H shape as shown in FIG. 1A by patterning a first conductive material layer 4 stacked on the nitride film 3 using a photolithography process (including an etching process; the same applies hereinafter). Further, the second lower electrode 12 is connected to an external circuit (not shown) with a trace 12*a*.

The fixation sections 23 are respectively disposed in four end portions of the second lower electrode 12 having the H shape. The fixation sections 23 are each formed by patterning a second conductive material layer 5 using the photolithography process, wherein the second conductive material layer 5 is stacked via the sacrifice layer stacked as the upper layer of the first conductive material layer 4. It should be noted that a part of the fixation section 23 is directly stacked on the second lower electrode 12 through an opening provided to the sacrifice layer.

The first conductive material layer 4 and the second conductive material layer 5 are each made of electrically-conductive polysilicon as a preferable example, but are not limited to the electrically-conductive polysilicon.

The upper electrode 20 is a 2n-fold rotationally symmetric body having 2n beams radially extending from a central part, wherein the natural number n is equal to 2. Specifically, as shown in FIG. 1A, the upper electrode 20 is a movable electrode (a vibrating body) having a cruciform shape with the four beams extending from the central part of the upper electrode 20, and is supported in the central part by the four support sections 25 respectively extending from the four fixation sections 23 disposed peripherally. The upper electrode 20 is formed by patterning the second conductive material layer 5 using the photolithography process, wherein the second conductive material layer 5 is stacked via the sacrifice layer stacked as the upper layer of the first conductive material layer 4. In other words, the four fixation sections 23, the four support sections 25, and the upper electrode 20 are formed integrally.

Further, the second lower electrode 12 having the H shape and the upper electrode 20 having the cruciform shape are disposed so that the respective center parts overlap each other so as to roughly coincide with each other in the plan view of the substrate 1, and so that the two beams extending in a lateral direction (the B-B direction) from the central part of the upper electrode 20 overlap the second lower electrode 12 (except the part of slits S2 described later) having the H shape.

Among the lower electrodes 10, the first lower electrode 11 is a stationary electrode and is formed by patterning the first conductive material layer 4 using the photolithography process, wherein an alternating-current voltage is applied between the stationary electrode and the upper electrode 20, which overlaps the first lower electrode 11 in the plan view of the substrate 1, and the first conductive material layer 4 is stacked on the nitride layer 3. The first lower electrode 11 is disposed in two places so as to overlap the two beams extending in a vertical direction (the A-A direction) from the central part of the upper electrode 20 when viewing FIG. 1A squarely, and connected by a trace 11*a* to the external circuit.

The first lower electrode 11 is formed of the first conductive material layer 4 in the same layer as the second lower electrode 12. Therefore, the first lower electrode 11 needs to be electrically isolated from the second lower electrode 12 as the stationary electrode for applying the electrical potential to the upper electrode 20, and the respective patterns (of the first lower electrode 11 and the second lower electrode 12) are separated from each other. The steps (unevenness) of the gaps for the separation are transferred to the upper electrode 20 formed of the second conductive material layer 5 as an uneven shape, wherein the second conductive material layer 5 is stacked via the sacrifice layer stacked as the upper layer of the first conductive material layer 4. Specifically, the uneven shape is formed in the upper electrode 20 at the portions of the separation sections (the slits S1) of the pattern as shown in FIGS. 1A and 1B.

The uneven shape provided to the upper electrode 20 affects the stiffness of the beams as the vibrating body, and therefore, may have a harmful influence on the vibration characteristics in some cases depending on the shape and the position of the uneven shape.

Figure 2A:
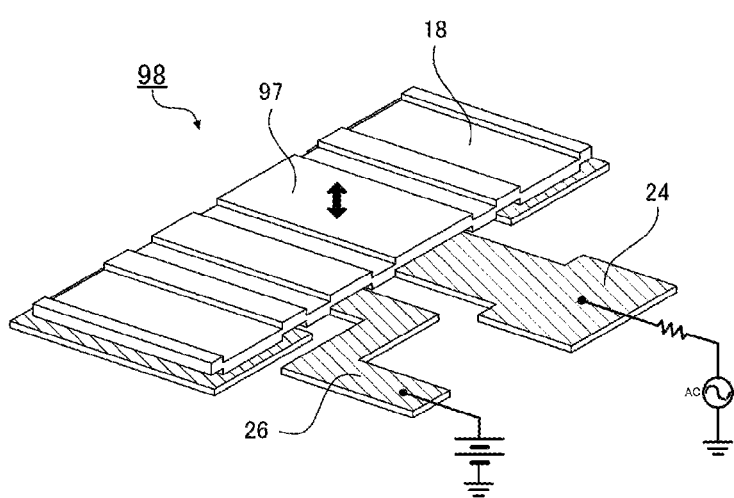
FIGS. 2A and 2B are a perspective view and a cross-sectional view showing apart of an example of a vibrator according to the related art.
Figure 2B:
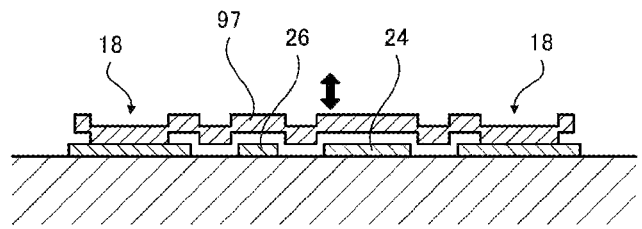

FIGS. 2A and 2B are diagrams showing a part of a vibrator 98 (FIG. 5*a* in Document 2) according to the related art. The vibrator 98 is a clamped-clamped beam vibrator, and both ends of a vibrating body 97 are fixed to the substrate with fixation sections (anchors 18). Further, two electrodes (strips 24, 26) are disposed under the vibrating body 97. As is understood from FIGS. 2A and 2B, since the two electrodes are different from each other in width and the distance from the fixation section at the both ends, it results that the stiffness of the vibrating body 97 due to the uneven shape transferred to the vibrating body 97 shows an uneven distribution. Due to the uneven stiffness, for example, the resonance peak value of the vibrating body 97 may be lowered, or the Q value of the vibration may be degraded in some cases.

Figure 3A:
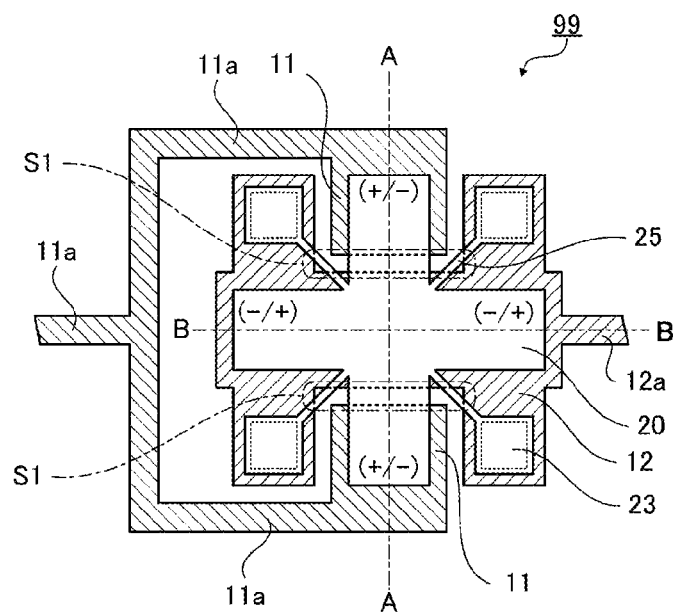
FIGS. 3A through 3C are a perspective view and cross-sectional views showing an example of a vibrator manufactured in the related art.
Figure 3B:
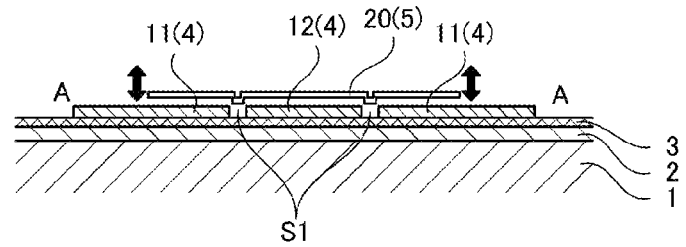

FIGS. 3A and 3B show an example of an MEMS vibrator manufactured with the related art technology without considering such an uneven shape transferred to the vibrating body. The MEMS vibrator 99 is configured similarly to the MEMS vibrator 100 except the point that the slits S2 described later are not provided to the first lower electrode 11, and the point that the transfer of the unevenness due to the slits S2 is not provided to the upper electrode 20.

Figure 3C:
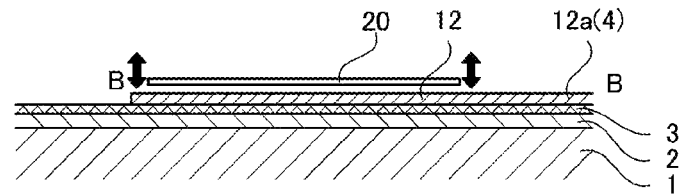

As shown in FIGS. 3A and 3B, in the MEMS vibrator 99, two beams of the upper electrode 20 extending in the vertical direction (the A-A direction) are provided with the uneven shape in the portions of the separation sections (the slits S1) of the pattern similarly to the MEMS vibrator 100. In contrast, as shown in FIG. 3C, two beams of the upper electrode 20 extending in the lateral direction (the B-B direction) are not provided with the uneven shape. This is because the second lower electrode 12 extending in the B-B direction in the area, on which the upper electrode 20 is stacked, is not provided with the separation section or the like, and is therefore formed evenly. As a result, a difference in stiffness occurs between the beams extending in the vertical direction (the A-A direction) from the central part of the upper electrode 20 and the beams extending in the lateral direction (the B-B direction).

Going back to FIGS. 1A through 1C, the MEMS vibrator 100 will be explained.

In the MEMS vibrator 100, the second lower electrode 12 is provided with a dummy slit pattern so as to prevent the difference in stiffness between the beams extending in the vertical direction (the A-A direction) from the central part of the upper electrode 20 and the beams extending in the lateral direction (the B-B direction) from occurring. Specifically, the dummy slits S2 are provided to the second lower electrode 12 extending in the B-B direction in the area overlapped by the upper electrode 20, wherein the slits S2 causes the uneven shape in the two beams of the upper electrode 20 extending in the lateral direction (the B-B direction) similarly to the uneven shape reflected by the slits S1 on the two beams of the upper electrode 20 extending in the vertical direction (the A-A direction). In other words, the slits S2 are formed so that the width of each of the slits S2 is roughly the same as the width of each of the slits S1, and the distance from a position overlapped by the center point of the upper electrode 20 to each of the slits S2 is roughly the same as the distance from a position similarly overlapped by the center point of the upper electrode 20 to each of the slits S1 in a plan view.

By disposing the dummy slits S2 in such a manner, the upper electrode 20 is configured as a 2n-fold rotationally symmetric body having 2n beams radially extending from the central part, wherein the natural number n is equal to 2, including the uneven part.

It should be noted that since the slits S2 are not formed for the purpose of electrically isolating the second lower electrode 12, the second lower electrode 12 is continuous in the areas in the both ends of each of the slits S2, which does not overlap the upper electrode 20 in the plan view.

In such a configuration, the MEMS vibrator 100 is configured as an electrostatic vibrator, and the tip area of each of the four beams of the upper electrode 20 vibrates as an antinode of the vibration due to the alternating-current voltage applied between the first lower electrode 11 and the upper electrode 20 from the external circuit via the traces 11a, 12a. In FIG. 1A, the symbol "(+/−)" indicates a part vibrating in a vertical direction (the thickness direction of the substrate 1) as the antinode of the vibration including the phase relationship of the vibration. The symbols show the fact that, for example, in the case in which the beam indicated by "+" moves upward (in a direction of getting away from the substrate 1), the adjacent beam indicated by "−" moves downward (in a direction of getting closer to the substrate 1).

As described hereinabove, according to the MEMS vibrator 100 of the present embodiment, the following advantages can be obtained.

The upper electrode 20 as the vibrating body is supported by the support sections 25 at the central part as the node of the vibration, and the shape of the upper electrode 20 presents the 2n-fold rotationally symmetric body having the 2n beams radially extending from the central part, wherein the natural number n is equal to 2. In other words, the four (=2n) beams radially extending from the central part (the node part of the vibration) have similar shapes to each other, and are arranged at regular intervals forming a rotationally symmetric body. Further, the upper electrode 20 as the vibrating body has an area overlapping the first lower electrode 11 disposed on the principal surface of the substrate 1 in the plan view of the substrate 1. Therefore, the MEMS vibrator 100 can be configured as the electrostatic beam-type vibrator vibrating in the thickness direction of the substrate 1 due to the alternating-current voltage applied between the first lower electrode 11 and the upper electrode 20. Further, in this configuration, since the vibration of the overall vibrating body is balanced out in the node part of the vibration by, for example, setting the phases of the vibrations of the respective beams adjacent to each other to be opposite to each other, the vibration leakage from the node part of the vibration supported by the support sections 25 can be suppressed.

Therefore, according to the present embodiment, even in the case of enhancing the miniaturization, it is possible to provide a higher-performance electrostatic beam-type vibrator, the vibration efficiency of which is inhibited from degrading, and the vibration leakage in which is suppressed.

Further, by disposing the dummy slits S2, the area of the first lower electrode 11 overlapping the upper electrode 20 in the plan view of the substrate 1 is configured as a shape of the 2n-fold rotationally symmetric body. By adopting such a configuration, it is possible to provide an electrostatic beam-type vibrator, which is more simply and conveniently manufactured, which is higher in vibration efficiency, and the vibration leakage in which is further suppressed. In the specific explanation, the first lower electrode 11 is formed of the electrically isolated pattern in the area overlapping the upper electrode 20. In the isolation section, since the first lower electrode 11 is separated, the uneven shape is formed. On the other hand, by forming the dummy slits S2 even in the parts, which do not need to electrically be separated, as in the case of the present embodiment, it is possible to form the area of the first lower electrode 11 overlapping the upper electrode 20 so as to have the shape of the 2n-fold rotationally symmetric body. The first lower electrode 11 electrically isolated by the slits S1 can electrically be connected to each other by achieving the connection in the area not overlapping the upper electrode 20 in the plan view. By adopting such a configuration, in the case of, for example, stacking the sacrifice layer on the first lower electrode 11, and then forming the upper electrode 20 so as to be stacked on the sacrifice layer in the manufacturing process of the vibrator, since the area of the first lower electrode 11, which overlaps the upper electrode 20 in the plan view, has the shape of the 2n-fold rotationally symmetric body, it is also possible to easily form the uneven shape of the upper electrode 20, on which the unevenness of the area of the first lower electrode 11 is reflected, to have the shape of the 2n-fold rotationally symmetric body. As a result, as described above, since the vibration of the overall vibrating body is balanced out in the node part of the vibration, it is possible to more easily and conveniently provide the electrostatic beam-type vibrator, which is higher in vibration efficiency, and the vibration leakage in which is suppressed.

Second Embodiment

Then, as a second embodiment, a method of manufacturing the vibrator (the MEMS vibrator 100) according to the first embodiment will be explained. It should be noted that in the explanation, the constituents identical to those in the embodiment described above will be denoted with the same reference symbols, and any redundant explanation will be omitted.

FIGS. 4A through 4G are process charts sequentially showing the method of manufacturing the MEMS vibrator 100. The states of the MEMS vibrator 100 in the respective processes are shown using the A-A cross-sectional view and the C-C cross-sectional view in FIG. 1A.

The method of manufacturing a vibrator according to the present embodiment is characterized by including a process of stacking the first conductive material layer 4 on the principal surface of the substrate 1, a first layer forming process of shaping the first conductive material layer 4 to form the lower electrodes 10 (the first lower electrode 11 and the second lower electrode 12), a process of stacking the sacrifice layer so as to cover the first lower electrode 11 and the second lower electrode 12, a process of shaping the sacrifice layer to form the opening sections 30 each adapted to expose at least a part of the second lower electrode 12, a process of stacking the second conductive material layer 5 so as to cover the sacrifice layer and the opening sections 30, a second layer forming process of shaping the second conductive material layer 5 to form the upper electrode 20 as the vibrating body having the area overlapping the first lower electrode 11 in the plan view of the substrate 1, fixation sections 23 each having the area overlapping the opening section 30, and the support sections 25 each extending from the fixation section 23 and connected to the central part of the upper electrode 20, and a process of removing the sacrifice layer by etching, and characterized in that the upper electrode 20 is formed in the second layer forming process so as to have the shape of the 2n-fold rotationally symmetric body having the 2n beams radially extending from the central part of the upper electrode 20 wherein n is a natural number, and the lower electrodes 10 are formed in advance in the first layer forming process so that the area of the lower electrodes 10 overlapping the upper electrode 20 becomes the 2n-fold rotationally symmetric body in the plan view of the substrate 1 after the second layer forming process. The specific explanation will hereinafter be presented.

Figure 4A:
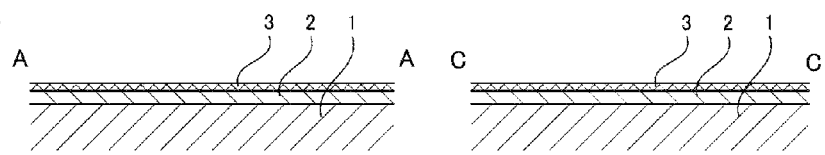
FIGS. 4A through 4G are process charts sequentially showing a method of manufacturing the vibrator according to the first embodiment.

FIG. 4A: The substrate 1 is prepared, and the oxide film 2 is stacked on the principal surface. Although the oxide film 2 is formed of a LOCOS (Local Oxidation of Silicon) oxide film, which is common as an element isolation layer of a semiconductor process, as a preferable example, the oxide film 2 can also be an oxide film by, for example, an STI (Shallow Trench Isolation) method depending on the semiconductor process generation.

Then, the nitride film 3 as an isolation layer is stacked. As the nitride film 3, $Si_3N_4$ is deposited using a LPCVD (Low Pressure Chemical Vapor Deposition) process. The nitride film 3 is resistant to buffered hydrogen fluoride as an etchant used when performing release etching on the sacrifice layer, and functions as an etching stopper.

Figure 4B:
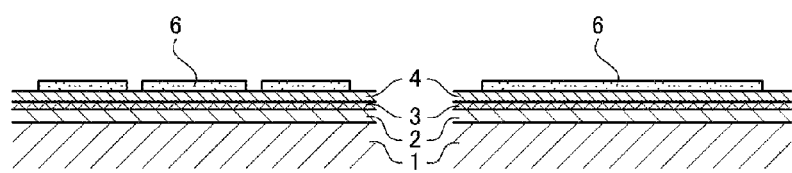
Figure 4C:
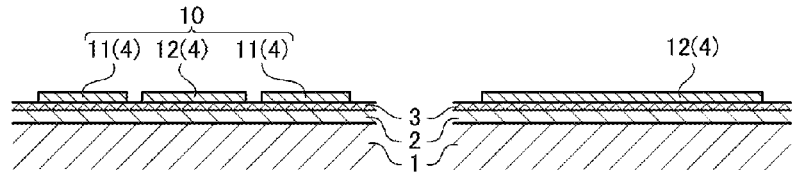

FIGS. 4B, 4C: Subsequently, as the first layer forming process, the first conductive material layer 4 is first stacked on the nitride film 3. The first conductive material layer 4 is a polysilicon layer for constituting the lower electrodes 10 (the first lower electrode 11, the second lower electrode 12), the traces 11a, 12a (see FIG. 1A), and so on, and is provided with a predetermined electrical conductivity by performing ion implantation after being stacked. Subsequently, a resist 6 is applied on the first conductive material layer 4, then patterning is performed using a photolithography process to thereby form the first lower electrode 11, the second lower electrode 12, and the traces 11a, 12a. In the first layer forming process, the lower electrodes 10, namely the first lower electrode 11 and the second lower electrode 12, are formed in advance so that the area of the lower electrodes 10 overlapping the upper electrode 20 becomes the 2n-fold rotationally symmetric body in the plan view of the substrate 1 after the second layer forming process.

Figure 4D:
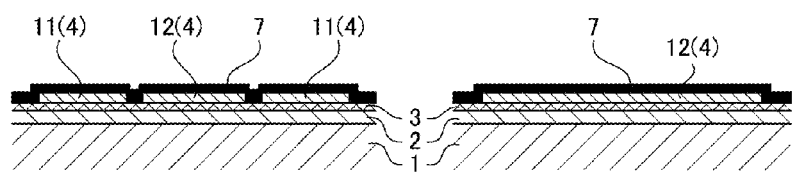

FIG. 4D: Subsequently, the sacrifice layer 7 is stacked so as to cover the lower electrodes 10 and the traces 11a, 12a. The sacrifice layer 7 is a sacrifice layer for forming the gap between the first lower electrode 11 and the second lower electrode 12, and the upper electrode 20 to thereby separate the upper electrode 20, and is formed of a CVD (Chemical Vapor Deposition) oxide film. In the sacrifice layer 7 thus stacked, there appears the unevenness due to the unevenness in the first lower electrode 11, the second lower electrode 12, and so on thus patterned.

Figure 4E:
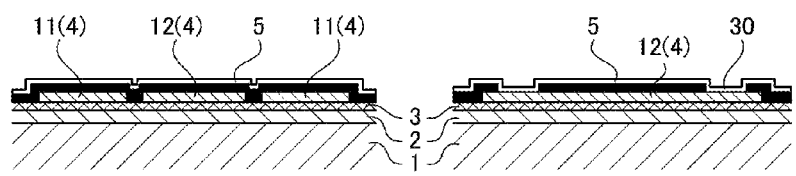

FIG. 4E: Subsequently, the sacrifice layer 7 is patterned using the photolithography process to thereby form the opening sections 30 through which the part of the second lower electrode 12 is exposed. The opening sections 30 form the bonding areas where the fixation sections 23 are bonded to the second lower electrode 12, and are fixed. The bonding areas are the areas where the upper electrode 20 is supported by the substrate 1 via the support sections 25, and therefore, the area of the opening is set to be sufficient to obtain the necessary stiffness.

Figure 4F:
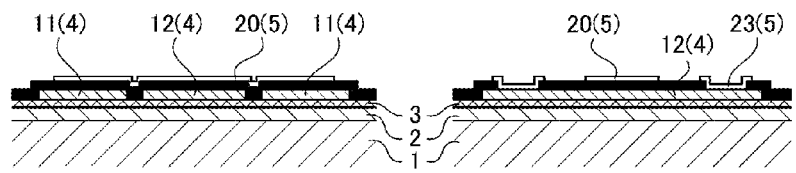

FIG. 4F: Subsequently, as the second layer forming process, the second conductive material layer 5 is first stacked so as to cover the sacrifice layer 7 and the opening sections 30. The second conductive material layer 5 is the polysilicon layer identical to the first conductive material layer 4, and is patterned using the photolithography process after being stacked, to thereby form the upper electrode 20, the fixation sections 23, and the support sections 25. As shown in FIG. 1A, the upper electrode 20 is formed to have the shape of the 2n-fold rotationally symmetric body having the 2n beams radially extending from the central part of the upper electrode 20 wherein n is a natural number, as the electrode having an area overlapping the first lower electrode 11 and the second lower electrode 12 in the plan view of the substrate 1. Further, after being stacked, the ion implantation is performed to provide the predetermined electrical conductivity.

Figure 4G:
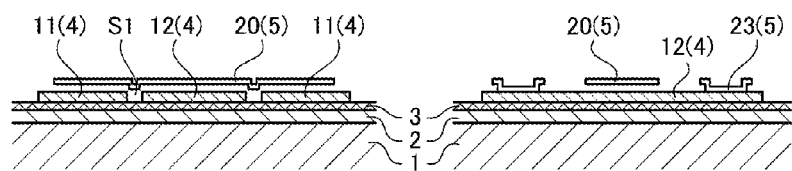

FIG. 4G: Subsequently, the substrate 1 is exposed to the etchant (a buffered hydrogen fluoride) to thereby remove the sacrifice layer 7 by etching (the release etching), and thus the gap between the first lower electrode 11 and the second lower electrode 12, and the upper electrode 20 is formed to thereby separate the upper electrode 20.

The MEMS vibrator 100 is formed in such a manner as described above.

It should be noted that it is preferable for the MEMS vibrator 100 to be installed in a hollow section sealed in a reduced pressure state. Therefore, when manufacturing the MEMS vibrator 100, the sacrifice layer for forming the hollow section, a sidewall section surrounding the sacrifice layer, a sealing layer for forming the lid of the hollow section, and so on are formed in combination, but the explanation is omitted here.

As described hereinabove, according to the method of manufacturing a vibrator according to the present embodiment, the following advantages can be obtained.

The upper electrode 20 as the vibrating body is supported by the support sections 25 at the central part, and is formed to have the shape of the 2n-fold rotationally symmetric body having the 2n beams radially extending from the central part. In other words, the 2n beams radially extending from the central part have similar shapes to each other, and are arranged at regular intervals forming the rotationally symmetric body. Further, the upper electrode 20 as the vibrating body is formed to have the area overlapping the first lower electrode 11 disposed on the principal surface of the substrate 1 in the plan view of the substrate 1. Therefore, the vibrator obtained by the present manufacturing method is configured as the electrostatic beam-type vibrator vibrating in the thickness direction of the substrate 1 due to the alternating-current voltage applied between the first lower electrode 11 and the upper electrode 20.

In this configuration, since the central part of the upper electrode 20 supported by the support sections 25 is configured as the node part of the vibration, and the vibration of the overall vibrating body is balanced out in the node part of the vibration by, for example, setting the phases of the vibrations of the respective beams adjacent to each other to be opposite to each other, the vibration leakage from the node part of the vibration supported by the support sections 25 can be suppressed.

Therefore, according to the method of manufacturing a vibrator according to the present embodiment, even in the case of enhancing the miniaturization, it is possible to provide a higher-performance electrostatic beam-type vibrator, the vibration efficiency of which is inhibited from degrading, and the vibration leakage in which is suppressed.

Third Embodiment

Then, as a third embodiment, a method of manufacturing the vibrator (the MEMS vibrator 100) according to the first embodiment will be explained. It should be noted that in the explanation, the constituents identical to those in the embodiment described above will be denoted with the same reference symbols, and any redundant explanation will be omitted.

FIGS. 5A through 5F are process charts sequentially showing the method of manufacturing the MEMS vibrator 100. The states of the MEMS vibrator 100 in the respective processes are shown using the A-A cross-sectional view and the B-B cross-sectional view in FIG. 1A.

The method of manufacturing a vibrator according to the present embodiment is characterized in that the sacrifice layer 7 is planarized to thereby reduce or eliminate the unevenness provided to the upper electrode 20 compared to the method of manufacturing a vibrator according to the second embodiment.

The method of manufacturing a vibrator according to the present embodiment is characterized by including a process of stacking the first conductive material layer 4 on the principal surface of the substrate 1, a first layer forming process of shaping the first conductive material layer 4 to form the lower electrodes 10, a process of stacking a first sacrifice layer 8 so as to cover the lower electrodes 10, a process of grinding to planarize the first sacrifice layer 8 so that the lower electrodes 10 are exposed, a process of stacking a second sacrifice layer 9 so as to cover the lower electrodes 10 thus planarized and the surface formed of the first sacrifice layer 8, a process of shaping the second sacrifice layer 9 to form the opening sections 30 each adapted to expose at least a part of the lower electrodes 10, a process of stacking the second conductive material layer 5 so as to cover the second sacrifice layer 9 and the opening sections 30, a second layer forming process of shaping the second conductive material layer 5 to form the upper electrode 20 as the vibrating body having the area overlapping the lower electrodes 10 in the plan view of the substrate 1, fixation sections 23 each having the area overlapping the opening section 30, and the support sections 25 each extending from the fixation section 23 and connected to the central part of the upper electrode 20, and a process of removing the sacrifice layers (the first sacrifice layer 8 and the second sacrifice layer 9) by etching, and characterized in that the upper electrode 20 is formed in the second layer forming process so as to have the shape of the 2n-fold rotationally symmetric body having the 2n beams radially extending from the central part of the upper electrode 20 wherein n is a natural number.

The specific explanation will hereinafter be presented.

Figure 5A:
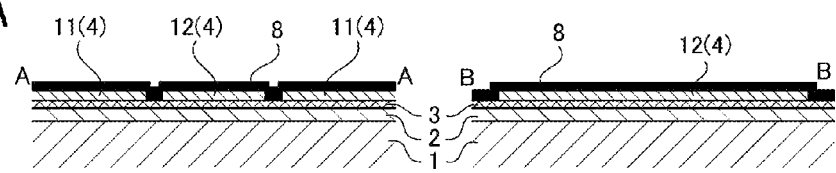
FIGS. 5A through 5F are process charts sequentially showing a method of manufacturing a vibrator according to a second embodiment of the invention.

FIG. 5A: Firstly, similarly to the second embodiment, the first layer forming process shown in FIG. 4C and the anterior processes are performed. Then, the first sacrifice layer 8 is stacked so as to cover the lower electrodes 10 (the first lower electrode 11, the second lower electrode 12) and the traces 11a, 12a (see FIG. 1A). The first sacrifice layer 8 is a sacrifice layer for infilling the unevenness generated by the patterning on the first conductive material layer 4, and is formed of, for example, a CVD (Chemical Vapor Deposition) oxide film.

Figure 5B:
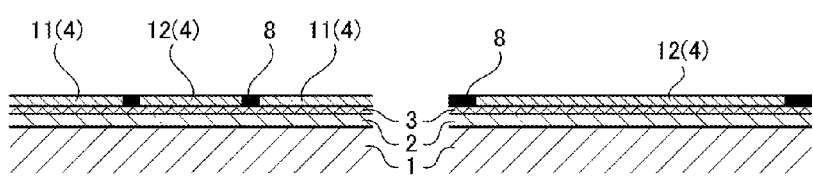

FIG. 5B: Subsequently, the first sacrifice layer 8 is ground to be planarized so as to expose the first conductive material layer 4 (the lower electrodes 10 (the first lower electrode 11, the second lower electrode 12) and the traces 11a, 12a). The grinding is performed using, for example, a CMP (Chemical Mechanical Polishing) process.

It should be noted that the planarization process performed on and after the first layer forming process is not limited to the process of planarizing the CVD oxide film using the CMP process, but can also be a process of, for example, achieving the planarization using TEOS (tetraethoxysilane) as an interlayer film (IMD (Inter Metal Dielectric)) used in a semiconductor process.

Figure 5C:
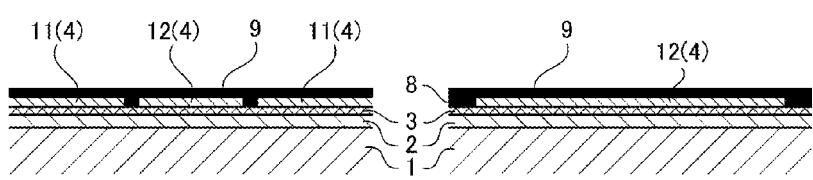

FIG. 5C: Subsequently, the second sacrifice layer 9 is stacked so as to cover the surface thus planarized. The second sacrifice layer 9 is a sacrifice layer for forming the gap between the first lower electrode 11 and the second lower electrode 12, and the upper electrode 20 to thereby separate the upper electrode 20, and is formed of a CVD (Chemical Vapor Deposition) oxide film. As a result of planarizing the stacking surface with the first sacrifice layer 8, the second sacrifice layer 9 stacked thereon is not provided with such unevenness (unevenness caused by the unevenness of the first lower electrode 11, the second lower electrode 12, and so on thus patterned) as is provided to the sacrifice layer 7 in the second embodiment.

Figure 5D:
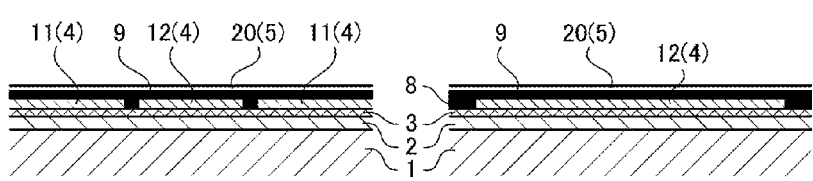

FIG. 5D: Subsequently, the second sacrifice layer 9 is patterned using a photolithography process, the opening sections 30 through which a part of the second lower electrode 12 is exposed are formed (not shown), and then the second conductive material layer 5 is first stacked as the second layer forming process so as to cover the second sacrifice layer 9 and the opening sections 30.

Figure 5E:
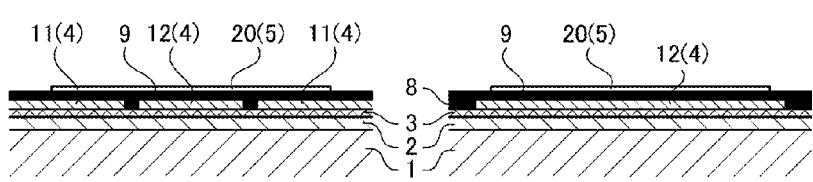

FIG. 5E: As the second layer forming process, the second conductive material layer 5 is then patterned using a photolithography process to thereby form the upper electrode 20, the fixation sections 23, and the support sections 25 (not shown). As shown in FIG. 1A, the upper electrode 20 is formed to have the shape of the 2n-fold rotationally symmetric body having the 2n beams radially extending from the central part of the upper electrode 20 wherein n is a natural number, as the electrode having an area overlapping the first lower electrode 11 and the second lower electrode 12 in the plan view of the substrate 1. Further, after being stacked, the ion implantation is performed to provide the predetermined electrical conductivity.

Figure 5F:
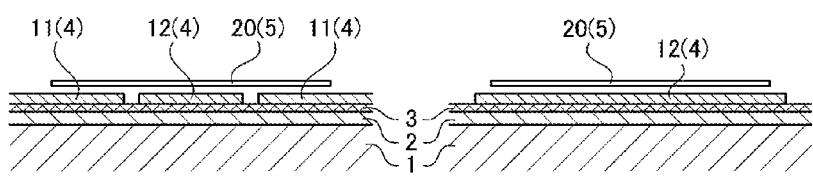

FIG. 5F: Subsequently, the substrate 1 is exposed to the etchant to thereby remove the sacrifice layers (the first sacrifice layer 8 and the second sacrifice layer 9) by etching.

The MEMS vibrator 100 is formed in such a manner as described above.

As described hereinabove, according to the method of manufacturing a vibrator according to the present embodiment, the following advantages can be obtained.

The first sacrifice layer 8, which is stacked so as to cover the lower electrodes 10 (the first lower electrode 11, the second lower electrode 12) and the traces 11a, 12a, is provided with the surface ground to be planarized. The upper electrode 20 is formed so as to be stacked on the second sacrifice layer 9, which is stacked on the surface thus planarized, and is therefore formed to have the shape with the unevenness suppressed without being affected by the lower electrodes 10. Further, the upper electrode 20 as the vibrating body is supported by the support sections 25 at the central part, and is formed to have the shape of the 2n-fold rotationally symmetric body having the 2n beams radially extending from the central part. In other words, the 2n beams radially extending from the central part have the respective shapes, which have the unevenness suppressed and are similar to each other, and are arranged at regular intervals forming the rotationally symmetric body. Further, the upper electrode 20 as the vibrating body is formed to have the area overlapping the first lower electrode 11 disposed on the principal surface of the substrate 1 in the plan view of the substrate 1. Therefore, the vibrator obtained by the present manufacturing method can be configured as the electrostatic beam-type vibrator vibrating in the thickness direction of the substrate 1 due to the alternating-current voltage applied between the first lower electrode 11 and the upper electrode 20.

Further, in this configuration, since the central part of the upper electrode 20 supported by the support sections 25 is configured as the node part of the vibration, and the vibration of the overall vibrating body is balanced out in the node part of the vibration by, for example, setting the phases of the vibrations of the respective beams adjacent to each other to be opposite to each other, the vibration leakage from the node part of the vibration supported by the support sections 25 can be suppressed.

Therefore, according to the method of manufacturing a vibrator according to the present embodiment, even in the case of enhancing the miniaturization, it is possible to provide a higher-performance electrostatic beam-type vibrator, the vibration efficiency of which is inhibited from degrading, and the vibration leakage in which is suppressed.

Oscillator

Then, an oscillator 200, to which the MEMS vibrator 100 is applied, as an oscillator according to an embodiment of the invention will be explained with reference to FIG. 6.

Figure 6:
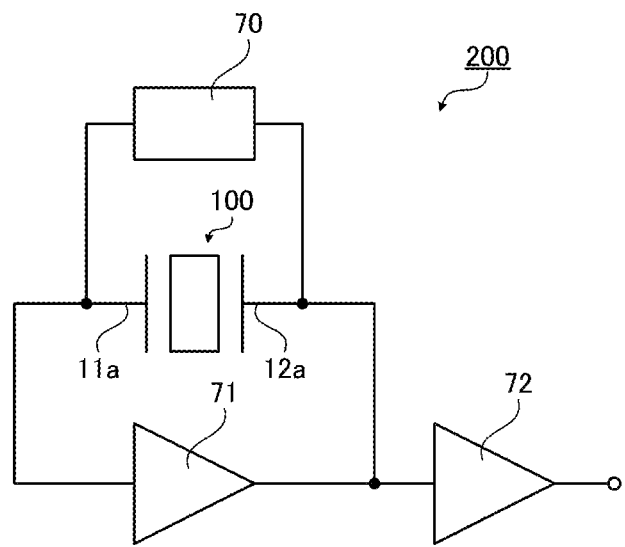
FIG. 6 is a schematic diagram showing a configuration example of an oscillator equipped with the vibrator according to the first embodiment.

FIG. 6 is a schematic diagram showing an example of a configuration of the oscillator equipped with the MEMS vibrator 100 according to an embodiment of the invention. The oscillator 200 includes the MEMS vibrator 100, a bias circuit 70, an amplifiers 71, 72, and so on.

The bias circuit is a circuit connected to the traces 11a, 12a of the MEMS vibrator 100, and applying an alternating-current voltage to the MEMS vibrator 100, wherein the alternating-current voltage is biased with a predetermined electrical potential.

The amplifier 71 is a feedback amplifier connected to the traces 11a, 12a of the MEMS vibrator 100 in parallel to the bias circuit 70. By performing the feedback amplification, the MEMS vibrator 100 is configured as an oscillator.

The amplifier 72 is a buffer amplifier for outputting an oscillation waveform.

According to the present embodiment, by making use of the vibrator, which has a higher vibration efficiency and is further miniaturized, as the oscillator, a higher-performance and miniaturized oscillator can be provided.

Electronic Apparatus

Then, an electronic apparatus, to which the MEMS vibrator 100 as an electronic component is applied, according to an embodiment of the invention will be explained with reference to FIGS. 7A, 7B, and 8.

Figure 7A:
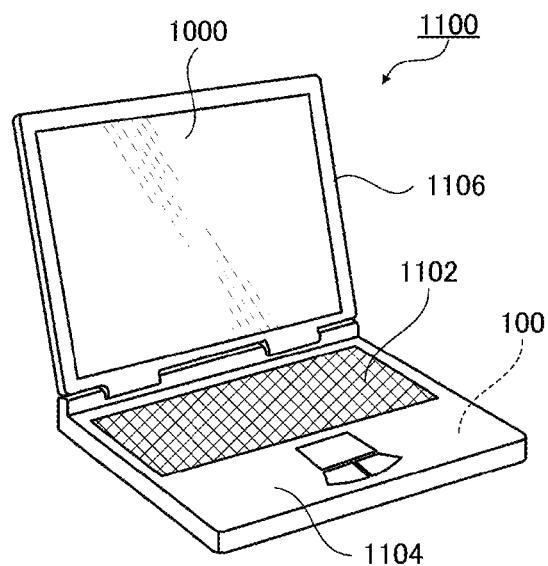
FIG. 7A is a perspective view showing a configuration of a mobile personal computer as an example of an electronic apparatus.

FIG. 7A is a perspective view showing a schematic configuration of a mobile type (or a laptop type) personal computer as the electronic apparatus equipped with the electronic component according to the embodiment of the invention. In the drawing, the personal computer 1100 includes a main body section 1104 provided with a keyboard 1102, and a display unit 1106 provided with a display section 1000, and the display unit 1106 is pivotally supported with respect to the main body section 1104 via a hinge structure. Such a personal computer 1100 incorporates the MEMS vibrator 100 as the electronic component functioning as a filter, a resonator, a reference clock, and so on.

Figure 7B:
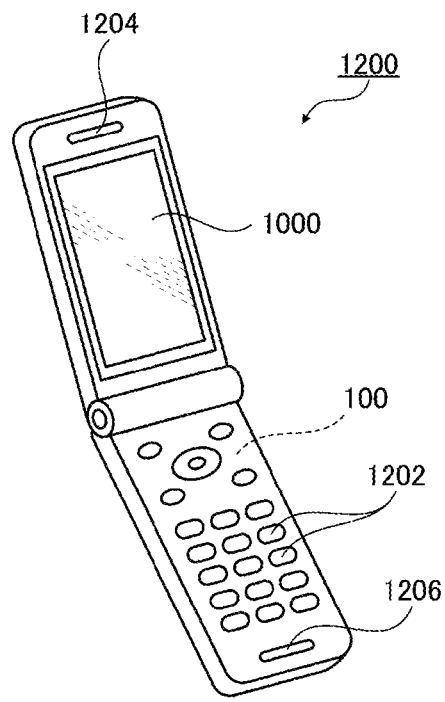
FIG. 7B is a perspective view showing a configuration of a cellular phone as an example of the electronic apparatus.

FIG. 7B is a perspective view showing a schematic configuration of a cellular phone (including PHS) as the electronic apparatus equipped with the electronic component according to the embodiment of the invention. In this drawing, the cellular phone 1200 is provided with a plurality of operation buttons 1202, an ear piece 1204, and a mouthpiece 1206, and the a display section 1000 is disposed between the operation buttons 1202 and the earpiece 1204. Such a cellular phone 1200 incorporates the MEMS vibrator 100 as the electronic component (a timing device) functioning as a filter, a resonator, an angular velocity sensor, and so on.

Figure 8:
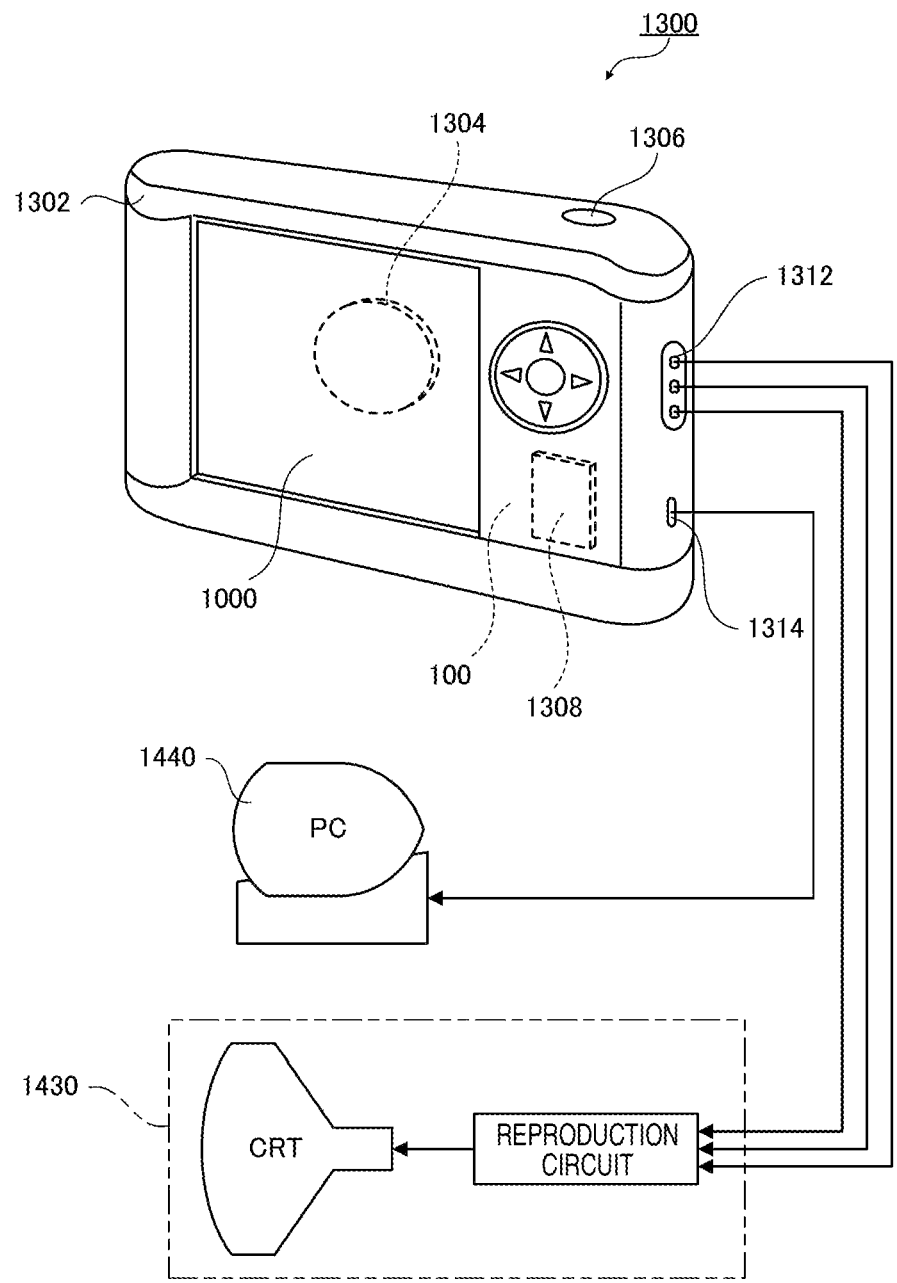
FIG. 8 is a perspective view showing a configuration of a digital still camera as an example of the electronic apparatus.

FIG. 8 is a perspective view showing a schematic configuration of a digital still camera as the electronic apparatus equipped with the electronic component according to the embodiment of the invention. It should be noted that the connection with external equipment is also shown briefly in this drawing. The digital still camera 1300 performs photoelectric conversion on an optical image of an object using an imaging element such as CCD (Charge Coupled Device) to thereby generate an imaging signal (an image signal).

A case (a body) 1302 of the digital still camera 1300 is provided with a display section 1000 disposed on the back surface thereof to have a configuration of performing display in accordance with the imaging signal from the CCD, wherein the display section 1000 functions as a viewfinder for displaying the object as an electronic image. Further, the front surface (the back side in the drawing) of the case 1302 is provided with a light receiving unit 1304 including an optical lens (an imaging optical system), the CCD, and so on.

When the photographer checks an object image displayed on the display section 1000, and then holds down a shutter button 1306, the imaging signal from the CCD at that moment is transferred to and stored in the memory device 1308. Further, the digital still camera 1300 is provided with video signal output terminals 1312 and an input-output terminal 1314 for data communication disposed on a side surface of the case 1302. Further, as shown in the drawing, a television monitor 1430 and a personal computer 1440 are respectively connected to the video signal output terminals 1312 and the input-output terminal 1314 for data communication according to needs. Further, there is adopted the configuration in which the imaging signal stored in the memory device 1308 is output to the television monitor 1430 and the personal computer 1440 in accordance with a predetermined operation. Such a digital still camera 1300 incorporates the MEMS vibrator 100 as the electronic component functioning as a filter, a resonator, an angular velocity sensor, and so on.

As described above, by making use of the vibrator, which has a higher vibration efficiency and is further miniaturized, as the electronic apparatus, a higher-performance and miniaturized electronic apparatus can be provided.

It should be noted that, the MEMS vibrator 100 as the electronic component according to the embodiment of the invention can also be applied to an electronic apparatus such as an inkjet ejection device (e.g., an inkjet printer), a laptop personal computer, a television set, a video camera, a car navigation system, a pager, a personal digital assistance (including one with a communication function), an electronic dictionary, an electric calculator, a computerized game machine, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 7A, the cellular phone shown in FIG. 7B, and the digital still camera shown in FIG. 8.

Moving Object

Then, a moving object, to which the MEMS vibrator 100 as a vibrator is applied, according to an embodiment of the invention will be explained with reference to FIG. 9.

Figure 9:
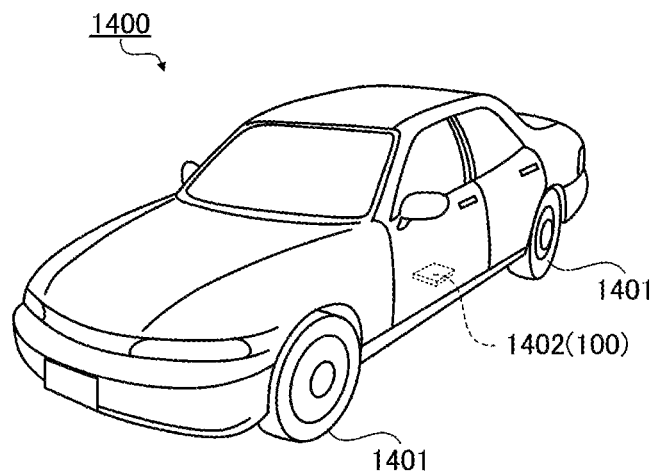
FIG. 9 is a perspective view schematically showing a vehicle as an example of a moving object.

FIG. 9 is a perspective view schematically showing a vehicle 1400 as the moving object equipped with the MEMS vibrator 100. The vehicle 1400 is equipped with a gyro sensor configured including the MEMS vibrator 100 according to the embodiment of the invention. For example, as shown in the drawing, in the vehicle 1400 as the moving object, an electronic control unit 1402 incorporating the gyro sensor and for controlling tires 1401 is installed. Further, as other examples, the MEMS vibrator 100 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle posture control system.

As described above, by making use of the vibrator, which has a higher vibration efficiency and is further miniaturized, as the moving object, a moving object, which is higher-performance and is superior in space utility, can be provided.

It should be noted that the invention is not limited to the embodiments described above, but various modifications or improvements can be provided to the embodiments described above. Some modified examples will be described below. Here, the constituents identical to those in any of the embodiments described above will be denoted with the same reference symbols, and any redundant explanation will be omitted.

Modified Example 1

Figure 10A:
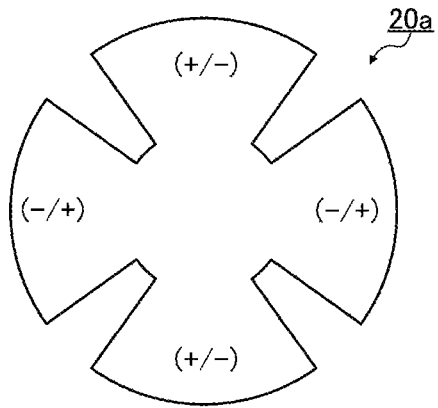
FIGS. 10A through 10C are plan views showing examples of a variation of an upper electrode as a vibrator according to a modified example 1.
Figure 10B:
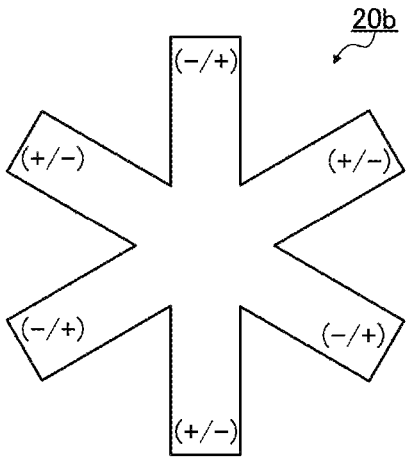
Figure 10C:
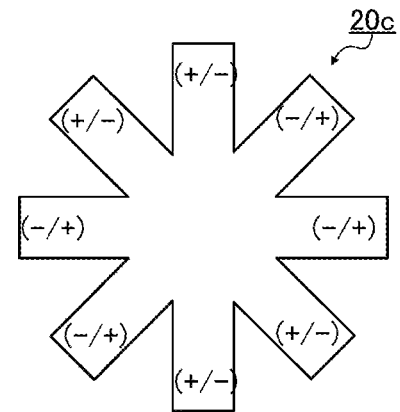

FIGS. 10A through 10C are plan views showing examples of a variation of an upper electrode as a vibrator according to a modified example 1.

Although in the first embodiment, the explanation is presented assuming that the upper electrode 20 is a vibrating body presenting the cruciform shape with the four beams extending from the central part of the upper electrode 20 as shown in FIG. 1A, the invention is not limited to this configuration. It is sufficient that the upper electrode is formed to be the 2n-fold rotationally symmetric body having the 2n beams radially extending from the node part of the vibration wherein n is a natural number.

FIG. 10A is a diagram of an example showing the upper electrode 20a formed to have a disk-like shape. Even the upper electrode having such a shape can be adopted providing the unevenness provided to the upper electrode due to the pattern shape of the lower electrode is formed so as to provide a four-fold rotationally symmetric body. In the case in which the upper electrode 20a vibrates so that the phases of the vibrations of the beams adjacent to each other are opposite to each other, there can be provided a beam-type vibrator, the vibration efficiency of which is inhibited from degrading, and the vibration leakage in which is suppressed.

FIG. 10B is a diagram of an example showing the upper electrode 20b in the case in which the natural number n is equal to 3. Even the upper electrode having such a shape can be adopted providing, for example, the unevenness provided to the upper electrode due to the pattern shape of the lower electrode is formed so as to provide a six-fold rotationally symmetric body. In the case in which the upper electrode 20b vibrates so that the phases of the vibrations of the beams adjacent to each other are opposite to each other, there can be provided a beam-type vibrator, the vibration efficiency of which is inhibited from degrading, and the vibration leakage in which is suppressed.

FIG. 10C is a diagram of an example showing the upper electrode 20c in the case in which the natural number n is equal to 4. Even the upper electrode having such a shape can be adopted providing, for example, the unevenness provided to the upper electrode due to the pattern shape of the lower electrode is formed so as to provide an eight-fold rotationally symmetric body. In the case in which the upper electrode 20c vibrates so that the phases of the vibrations of the beams adjacent to each other are opposite to each other, or the case in which the two beams adjacent to each other vibrate in the same phase as a pair, and the phases of the vibrations of the pairs adjacent to each other are opposite to each other as shown in FIG. 10C, there can be provided a beam-type vibrator, the vibration efficiency of which is inhibited from degrading, and the vibration leakage in which is suppressed.

As a specific embodiment of the variations of the upper electrode in the vibrator according to the modified example 1 shown in FIGS. 10A through 10C described above, the vibrator according to the modified example 1 provided with the upper electrode 20a shown in FIG. 10A will be explained.

Figure 11:
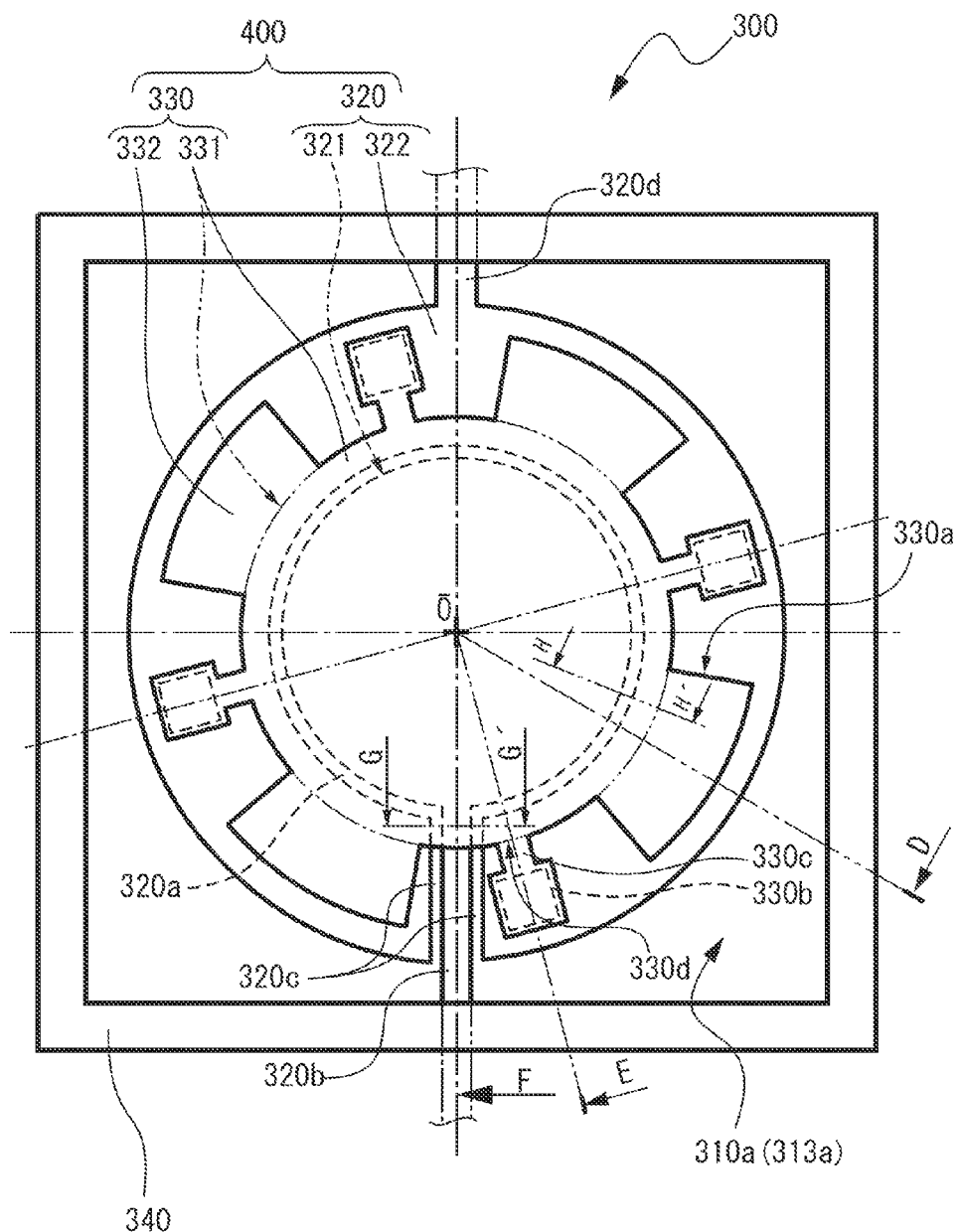
FIG. 11 is a plan view showing a vibratory device equipped with the vibrator according to the modified example 1 in the state of removing a lid section and a cover layer.
Figure 12A:
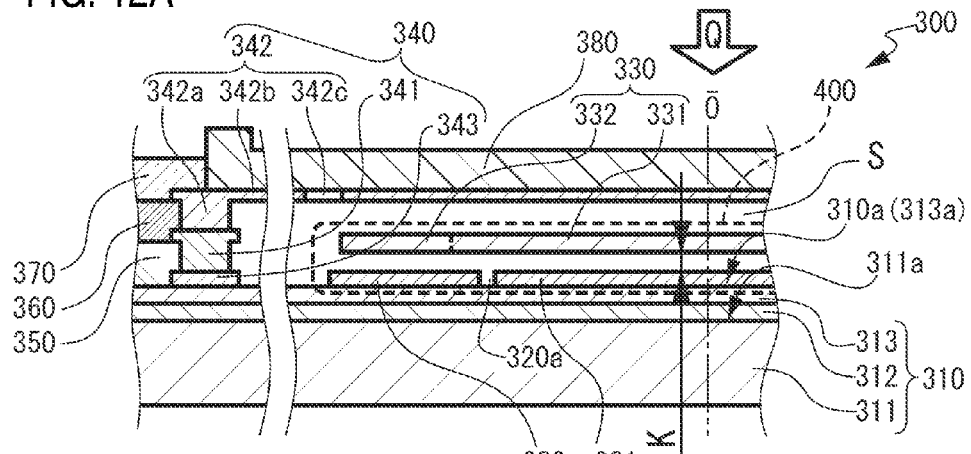
Figure 12B:
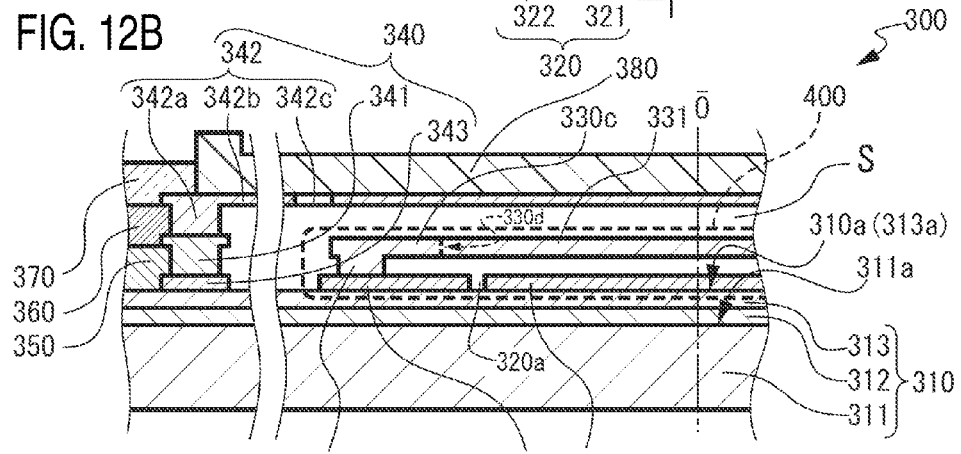
Figure 12C:
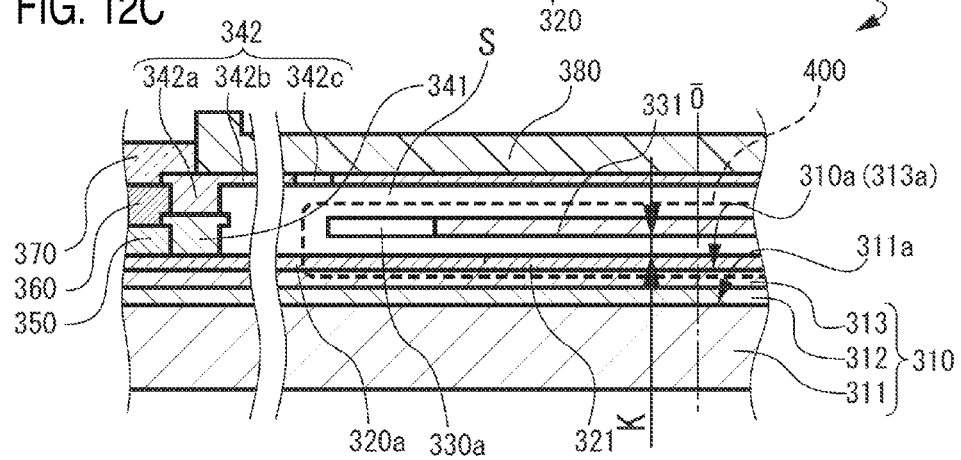

FIGS. 11, and 12A through 12C show a vibratory device 300 as an embodiment using a vibrator 400 provided with an upper electrode having a basic configuration identical to that of the upper electrode 20a having the disk-like shape shown in FIG. 10A as the modified example 1. FIG. 11 is a plan view of the vibratory device 300 as the vibrator according to the present embodiment in the state of removing a cover layer and a lid section described later, FIG. 12A shows a cross-sectional view in the O-D section shown in FIG. 11, FIG. 12B shows a cross-sectional view in the O-E section shown in FIG. 11, and FIG. 12C shows a cross-sectional view in the O-F section shown in FIG. 11. As shown in FIGS. 12A through 12C, the vibratory device 300 according to the present embodiment is provided with a substrate 310 including a wafer substrate 311, a first oxide film 312 formed on one surface 311a of the wafer substrate 311, a nitride film 313 formed on the first oxide film 312. The wafer substrate 311 is a silicon substrate, and the vibratory device 300 is manufactured using semiconductor manufacturing equipment and a semiconductor manufacturing method.

Lower electrodes 320 as stationary electrodes are formed on a principal surface 310a of the substrate 310, namely a surface 313a of the nitride film 313. The lower electrodes 320 include a first lower electrode 321 and a second lower electrode 322. As shown in FIG. 11, the first lower electrode 321 is the stationary electrode having a circular planar shape, and the second lower electrode is formed to have a ring-like shape with a spacer section 320a on the outer periphery of the first lower electrode 321. From the first lower electrode 321, there extends a single first external connection trace 320b as an external connection trace to be connected to external wiring not shown. As shown in FIG. 11, the second lower electrode 322 is provided with a spacer section 320c for wiring the first external connection trace 320b.

Further, an upper electrode 330 provided with a first vibrating section 331 and a second vibrating section 332 is formed separately from the first lower electrode 321 and the second lower electrode 322. The first vibrating section 331 is formed to have a circular shape so as to overlap the first lower electrode 321. Further, the center of the circular outer circumference of the first vibrating section 331 and the center of the circular shape of the first lower electrode 321 are made to roughly coincide with each other, namely disposed so-called concentrically in the plan view of the principal surface 310a, namely in an arrow view in the direction of the arrow Q shown in FIG. 12A. The second vibrating section 332 is disposed outside of the outer circumference of the first vibrating section 331 so as to extend in three directions in the present embodiment, and has a so-called fan shape provided with a circular outer shape. In other words, the second vibrating section 332 is configured by forming a plurality of cutout sections 330a each extending from the circular outer shape to the first vibrating section 331.

The upper electrode 330 is supported by support electrodes 330c, which are connected at connection sections 330d on the outer edge of the first vibrating section 331 in the cutout sections 330a of the second vibrating section 332, and extend from the connection sections 330d, and the other end of each of the support electrodes 330c is connected to a fixation electrode 330b formed on the principal surface 310a via the second lower electrode 322. As described above, by supporting and fixing the upper electrode 330 to the support electrodes 330c connected to the fixation electrodes 330b, a gap section K is formed between the first lower electrode 321 and the first vibrating section 331, and between the second lower electrode 322 and the second vibrating section 332, and the vibrator 400 of the vibratory device 300 is formed by the first lower electrode 321 and the first vibrating section 331, and the second lower electrode 322 and the second vibrating section 332.

It should be noted that compared to the upper electrode 20a shown in FIG. 10A, the upper electrode 330 in the present embodiment is different in the point that the support electrodes 330c and the fixation electrodes 330b are provided, and the configuration (the shape) of the second vibrating section 332 is the same.

As shown in FIG. 11, the lower electrodes 320 include the first lower electrode 321 formed on the principal surface 310a so as to be opposed to the first vibrating section 331, and the second lower electrode 322 formed on the outer circumference of the first lower electrode 321. The first lower electrode 321 has a circular outer shape, and the second lower electrode 322 has an annular shape concentric with the first lower electrode 321, a so-called doughnut shape. The first external connection trace 320b to be connected to the external wiring not shown is disposed so as to extend from the first lower electrode 321, and the spacer section 320c for preventing the short circuit with the second lower electrode 322 is formed. The spacer section 320c also forms a cutout section of the second lower electrode 322. The first external connection trace 320b extending from the first lower electrode 321 is formed as a single trace (in one place) in the vibratory device 300, and the location of the first external connection trace 320b is not limited.

The second lower electrode 322 is also provided with a second external connection trace 320d extending from the outer circumference of the second lower electrode 322, and connected to the external wiring not shown. The second external connection trace 322d is formed as a single trace (in one place) in the present embodiment, but is not limited to this configuration. A plurality of second external connection traces can also be formed, and further, the location of the second external traces is not limited.

As shown in FIGS. 12A through 12C, the vibrator 400 is formed so as to be housed in a space section S formed on the principal surface 310a of the substrate 310, namely the surface 313a of the nitride film 313. The space section S is formed in such a manner as described below. After forming the lower electrodes 320, a second oxide film 350 is formed. In the second oxide film 350, at the same time as the formation of the lower electrodes 320, using polysilicon, a hole for exposing a lowermost layer 343 of the space wall section 340 described later is formed so as to establish connection with the lowermost layer 343, and a first wiring layer 341 is formed by patterning using a photolithography process.

Further, a third oxide film 360 is formed on the second oxide film 350. The third oxide film 360 is provided with a hole for exposing the first wiring layer 341, and a second wiring layer 342 is formed by patterning using a photolithography process. The second wiring layer 342 is provided with a wall section 342a and a lid section 342b, wherein the wall section 342a constitutes the uppermost layer of the space wall section 340 described later, and the lid section 342b constitutes the space S for housing the vibrator 400. Further, the lid section 342b of the second wiring layer 342 is provided with an opening 342c for performing release etching of the second oxide film 350 and the third oxide film 360 existing in the area of the space S formed in the manufacturing process for forming the space S.

Then, a protective film 370 is formed so as to expose the opening 342c of the second wiring layer 342, an etchant for etching the second oxide film 350 and the third oxide film 360 is introduced through the opening 342c, and the space S is formed by the release etching. The space S is an area surrounded by the space wall section 340 formed of the lowermost layer 343, the first wiring layer 341, and the second wiring layer 342.

The gap section K provided to the vibrator 400 is formed by the release etching performed when forming the space S described above. Specifically, after forming the lower electrodes 320, a fourth oxide film not shown is formed on the lower electrodes 320, and the first vibrating section 331 and the second vibrating section 332 are formed on the fourth oxide film. Then, the fourth oxide film is removed by the release etching together with the second oxide film 350 and the third oxide film 360, and thus, the gap section K is formed. It should be noted that the second oxide film 350, the third oxide film 360, and the fourth oxide film in the area corresponding to the space S to be removed by the release etching described above are called sacrifice layers.

When the release etching is completed, and the space S is formed, a cover layer 380 is formed to cover the lid section 342b of the second wiring layer 342 not covered by the protective film 370, and the opening 342c is sealed. Thus, the space S is sealed airtightly.

Figure 13A:
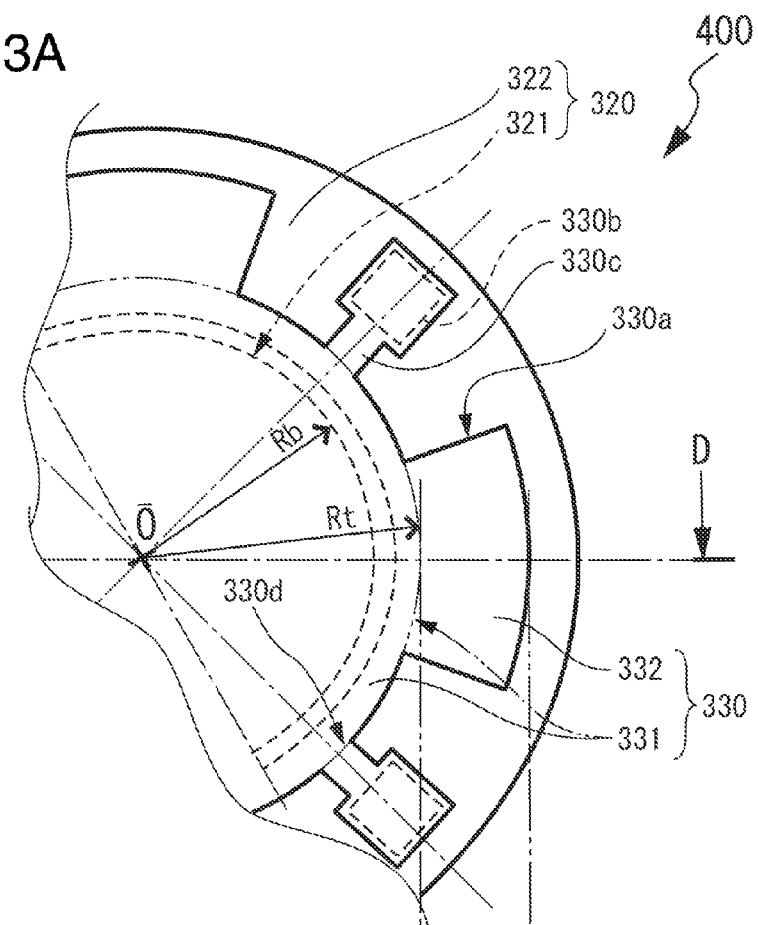
Figure 13B:
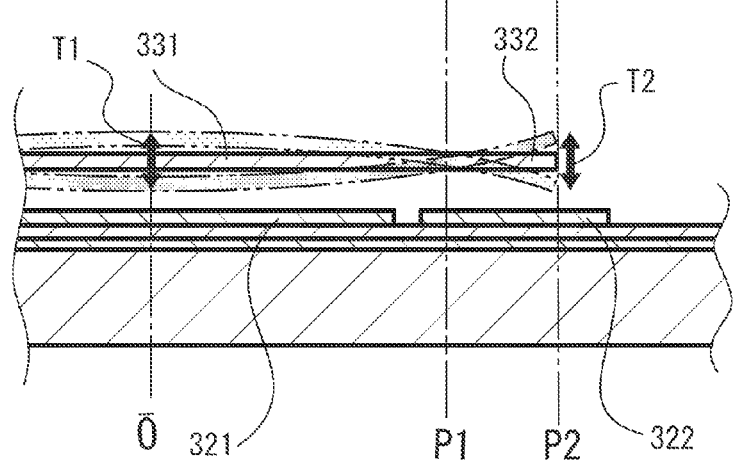

An action of the first vibrating section 331 and the second vibrating section 332 of the upper electrode 330 of the vibrator 400 formed in such a manner as described above will be explained with reference to FIGS. 13A and 13B. FIG. 13A shows a partial plane in the plan view of the principal surface 310a of the vibrator 400, and FIG. 13B shows a cross-sectional view of the vibrator 400 in the O-D section in FIG. 11. As shown in FIGS. 13A and 13B, in the vibrator 400, an alternating charges are applied to the first lower electrode 321 and the first vibrating section 331, the first vibrating section 331 is pulled toward the first lower electrode 321 due to the electrostatic force, and the vibration in the T1 direction shown in the drawing is excited.

Since the second vibrating section 332 is fed by the second lower electrode 322 via the fixation electrodes 330b, the in-phase charges are applied to the second vibrating section 332 and the second lower electrode 322, and the electrostatic force in the direction of getting away from the second lower electrode acts on the second vibrating section 332, and thus, the vibration in the T2 direction shown in the drawing is excited. Therefore, the vibration T1 and the vibration T2 are excited as the vibrations having the respective phases reverse to each other. In this case, the region where no displacement occurs due to the vibration of the upper electrode 330, namely the node of the vibration is located at the outer circumference position of the first vibrating section 331, namely the position P1 (hereinafter referred to as a node P1 of the vibration) shown in FIG. 13B, which is the position of the connection section 330d between the support electrode 330c and the first vibrating section 331. Therefore, in the vibrator 400, the displacement of the vibration becomes the largest at the position of the center O of the first vibrating section 331 or the outer circumference position P2 of the second vibrating section 332, and the displacement of the vibration at the position of the node P1 of the vibration becomes the smallest.

As described above, as shown in FIG. 13B, in the vibrator 400, the first vibrating section 331 deforms so as to have a spherical shape having the maximum displacement position at the center O, and the vibration is excited. Specifically, as also shown in FIG. 11 or the FIG. 13A, since the outer shape of the first vibrating section 331 is formed to have a circular shape, the spherical deformation taking the center O of the first vibrating section 331 as the maximum displacement portion is provided.

Incidentally, deformed portions shown in FIGS. 14A through 14C occur in the first vibrating section 331 in the manufacturing process. FIG. 14A is an enlarged cross-sectional view of the G-G' section shown in FIG. 11, FIG. 14B is an enlarged cross-sectional view of the H-H' section shown in FIG. 11, and FIG. 14C is a schematic perspective external view of the vicinity of the first external connection trace 320b shown in FIG. 11.

As shown in FIGS. 14A and 14B, minute recessed sections 331a, 331b are formed in the regions opposed to the spacer sections 320a, 320c in the lower electrodes 320 of the first vibrating section 331. The recessed sections 331a, 331b are formed in the manufacturing process shown in FIGS. 15A through 15D. As described above, the gap section K between the upper electrode 330 and the lower electrodes 320 shown in FIGS. 11, 14A, and 14B is formed in the manufacturing process of the vibrator 400 in such a manner as described below.

Figure 15A:
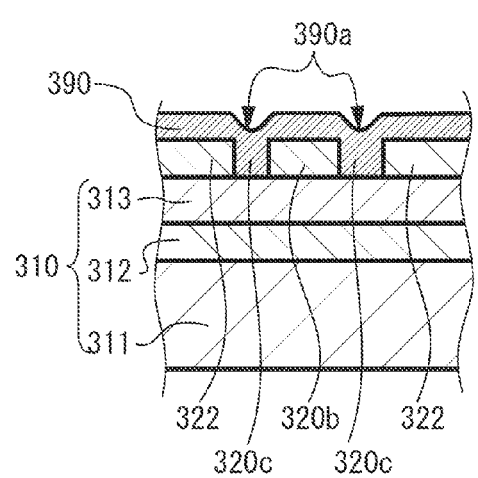
FIGS. 15A through 15D are cross-sectional views showing a method of manufacturing the vibratory device equipped with the vibrator according to the modified example 1.

FIGS. 15A through 15D are schematic cross-sectional view for explaining a part of the manufacturing process of the upper electrode 330 taking FIG. 14A, which is the cross-sectional view of the G-G' section shown in FIG. 11, as a representative example. Firstly, as shown in FIG. 15A, the fourth oxide film 390 is deposited on the principal surface 310a of the substrate 310, on which the lower electrodes 320 are formed by patterning. The fourth oxide film 390 at this moment is deposited on the upper surface of the lower electrodes 320 with the thickness corresponding to the gap section K. Therefore, in the area of the spacer section 320c formed between the first external connection trace 320b and the second lower electrode 322, the recessed sections 390a occur on the surface of the fourth oxide film 390.

Figure 15B:
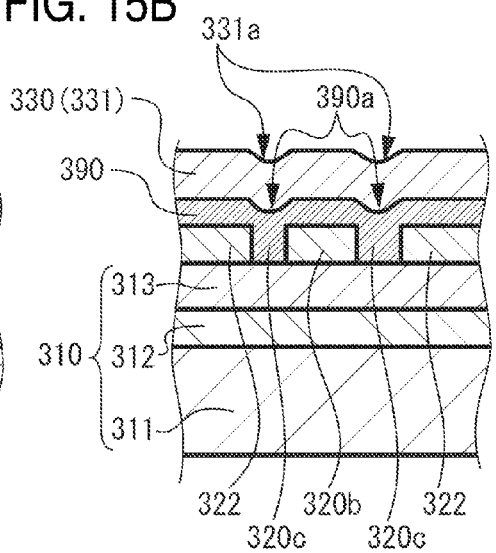

Then, as shown in FIG. 15B, the upper electrode 330 is formed on the surface of the fourth oxide film 390, on which the recessed sections 390a occur, by patterning the polysilicon using a photolithography process. Since the upper electrode 330 is formed as an electrode film with a uniform film thickness, the recessed sections 331a of the electrode are formed on the surface of the first vibrating section 331 so as to copy the recessed sections 390a occurring in the fourth oxide film 390.

Figure 15C:
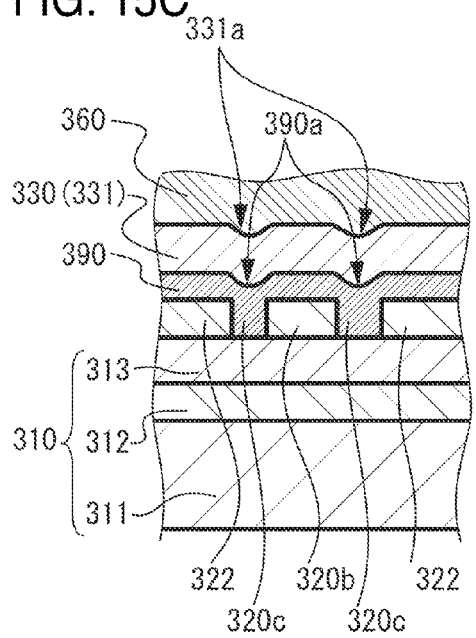
Figure 15D:
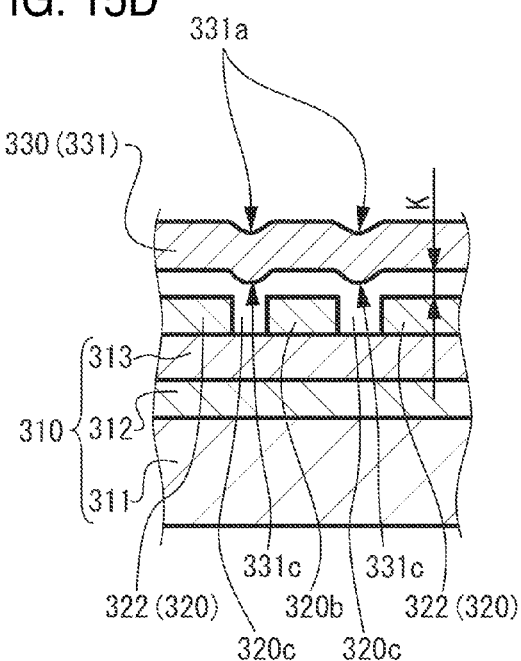

Then, as shown in FIG. 15C, the third oxide film 360 is deposited on the upper electrode 330, and further, the second wiring layer 342 provided with the lid section 342b not shown is formed (see FIGS. 12A through 12C). The lid section 342b of the second wiring layer 342 is provided with the opening 342c, the etchant for removing the oxide films is introduced through the opening 342c, then the release etching for removing the oxide films in the space S is performed, and the gap section K is formed between the upper electrode 330 and the lower electrodes 320 as shown in FIG. 15D. Thus, the first vibrating section 331 of the upper electrode 330 is provided with the recessed sections 331a and protruding sections 331c formed in the regions corresponding to the recessed sections 390a of the fourth oxide film 390.

As described above, in the manufacturing process of the vibrator 400, there are formed the recessed sections 331a shown in FIG. 14A, and the protruding sections 331c on the opposite surface side of the recessed sections 331a in the upper electrode 330. Further, there are formed the recessed section 331b shown in FIG. 14B, and a protruding section 331d on the opposite surface side of the recessed section 331b in the upper electrode 330.

Although the first vibrating section 331 has a circular shape as described above, since the recessed sections 331a, 331b and the protruding sections 331c, 331d shown in FIGS. 14A through 14C exist in the first vibrating section 331 with respect to the vibration in the T1 direction shown in FIG. 13B, there arises an influence that it becomes difficult to obtain the resonant frequency as the desired vibration characteristics, which can be obtained in the disk-like shape. It should be noted that since the recessed section 331b appears to have a circular shape as shown in the drawings, it can be determined that the influence on the vibration characteristics is small. In contrast, the recessed sections 331a are disposed so as to extend toward the center of the first vibrating section 331 to hinder the spherical deformation in the vibration, and thus, significantly affect the vibration characteristics.

Therefore, in the vibrator 400 according to the present embodiment, by limiting the spacer section 320c between the second lower electrode 322 and the first external connection trace 320b causing the recessed sections 331a to the single first external connection trace 320b (the one place), the influence of the first vibrating section 331 on the vibration characteristics is suppressed. Further, it is preferable to form the recessed sections 331a to have the extending length in the direction toward the center of the first vibrating section 331 as described below.

In the vibrator 400 shown in FIG. 13A, assuming that the radius of the first vibrating section 331 having the circular shape is Rt, and the radius of the first lower electrode 321 having the circular shape is Rb, it is preferable to fulfill the following formula.

$$0.67 \leq Rb/Rt \leq 0.7 \qquad \text{(Formula 1)}$$

By configuring the first vibrating section 331 and the first lower electrode 321 in such a manner as described above, it is possible to obtain a vibratory device provided with a vibrator in which contact between the first lower electrode 321 and the outer circumference of the circular shape of the first vibrating section 331, namely a sticking phenomenon, is suppressed, and the maximum signal amplitude can be obtained. It should be noted that although the recessed sections 331a are not formed if the following relationship is fulfilled, the common mode vibration to the first vibrating section 331 is excited in the second vibrating section 332, and it becomes difficult to obtain the resonant frequency as the desired vibration characteristics.

$$Rt > Rb$$

In the manufacturing process of the vibrator 400 of the vibratory device 300 according to the present embodiment shown in FIGS. 15A through 15D, the upper electrode 330 including the first vibrating section 331 and the second vibrating section 332 is supported by the plurality of support electrodes 330c connected to the fixation electrodes 330b, via the second lower electrode 322 formed on the principal surface 310a in the release etching process shown in FIG. 15D. Therefore, even in the case in which the support stiffness of the upper electrode 330 is high, and the gap section K is set to be extremely narrow, the so-called sticking phenomenon, in which the upper electrode 330 partially sticks the lower electrodes 320, can be inhibited from occurring.

Further, although the spherical vibration mode, namely the third-order vibration, is normally excited in the upper electrode 330 including the first vibrating section 331, since the recessed sections 331a or the protruding sections 331c provided to the first vibrating section 331 function as a rib structure section, namely a so-called reinforcement structure, the spurious as the fourth or higher order vibration mode appears. The appearance of the spurious makes it difficult to obtain the accurate resonant frequency of the vibrator 400. Since the first external connection trace 320b for establishing the connection from the first lower electrode 321 to the external electrode is the trace necessary to be formed, it is difficult to eliminate the appearance of the spurious. However, by limiting the number of the first external connection traces 320*b* to one, and fulfilling the condition of Formula 1 described above, it is possible to suppress the influence of the spurious, and obtain the desired resonant frequency.

Modified Example 2

FIGS. 16A through 16D are process charts sequentially showing a method of manufacturing a vibrator according to a modified example 2.

Although in the third embodiment, the explanation is presented assuming that the third embodiment is characterized in that the first sacrifice layer 8 is planarized to thereby reduce or eliminate the unevenness provided to the upper electrode 20, it is also possible to adopt a configuration of providing new unevenness independent of the unevenness of the lower electrodes 10 to the upper electrode 20. The specific explanation will hereinafter be presented.

Figure 16A:
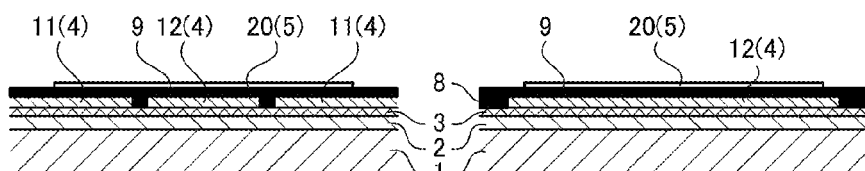
FIGS. 16A through 16D are process charts sequentially showing a method of manufacturing a vibrator according to a modified example 2.

FIG. 16A: Firstly, similarly to the third embodiment, the second layer forming process shown in FIG. 5E and the anterior processes are performed to thereby form the upper electrode 20.

Figure 16B:
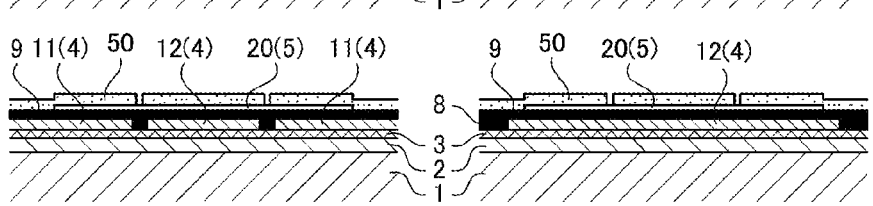
Figure 16C:
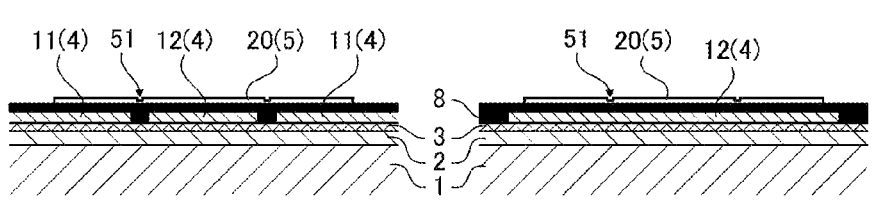

FIGS. 16B, 16C: Subsequently, the upper electrode 20 and the second sacrifice layer 9 are coated with a resist 50, and then half etching is performed on the areas of the upper electrode 20 where recessed sections as the new unevenness are formed using a photolithography process.

Figure 16D:
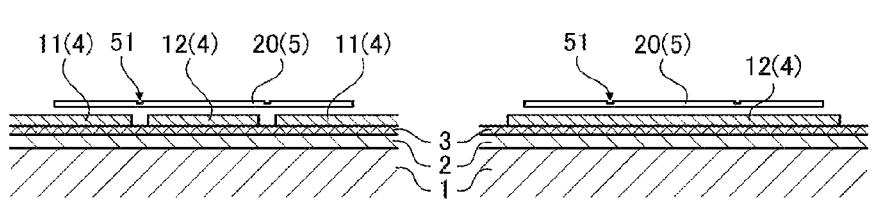

FIG. 16D: Subsequently, the substrate 1 is exposed to the etchant to thereby remove the sacrifice layers (the first sacrifice layer 8 and the second sacrifice layer 9) by etching.

In the manufacturing method according to the present modified example, the new recessed sections 51 are formed on the upper part of the upper electrode 20 by half etching. The new recessed sections 51 are for controlling the distribution of the stiffness of the upper electrode 20, and by forming the recessed sections 51 with desired shapes or desired depths at desired locations, it is possible to provide a desired variation to the vibration characteristics of the upper electrode as the vibrating body vibrating vertically. For example, the present modified example can be used in the case of improving the vibration characteristics of the upper electrode with the unevenness suppressed due to the manufacturing method according to the third embodiment.

The entire disclosure of Japanese Patent Application No. 2013-061554, filed Mar. 25, 2013 and No. 2012-284481, filed Dec. 27, 2012 are expressly incorporated by reference herein.

What is claimed is:

1. A vibrator comprising:
a substrate;
a lower electrode disposed above a principal surface of the substrate;
a fixation section disposed above the principal surface of the substrate;
a support section extending from the fixation section; and
an upper electrode supported by the support section so as to be separated from the substrate,
wherein the upper electrode is a vibrating body having an area overlapping the lower electrode in a plan view of the substrate,
the support section is connected to a node part of a vibration provided to the upper electrode as the vibrating body, and
the upper electrode is a 2n-fold rotationally symmetric body having 2n beams extending from the node part of the vibration, wherein n is a natural number.

2. The vibrator according to claim 1, wherein
an area of the lower electrode overlapping the upper electrode in the plan view of the substrate has a shape of a 2n-fold rotationally symmetric body.

3. The vibrator according to claim 2, wherein
the lower electrode has a dummy slit so that the area of the lower electrode overlapping the upper electrode in the plan view of the substrate has a shape of the 2n-fold rotationally symmetric body.

4. A method of manufacturing a vibrator, comprising:
stacking a first conductive material layer on a principal surface of a substrate;
shaping the first conductive material layer to form a lower electrode;
stacking a sacrifice layer so as to overlap the lower electrode;
shaping the sacrifice layer to form an opening section adapted to expose at least a part of the lower electrode;
stacking a second conductive material layer so as to overlap the sacrifice layer and the opening section;
shaping the second conductive material layer to form an upper electrode as a vibrating body having an area overlapping the lower electrode in a plan view of the substrate, a fixation section having an area overlapping the opening section, and a support section extending from the fixation section and connected to a central part of the upper electrode; and
removing the sacrifice layer by etching,
wherein in the shaping of the second conductive material layer, the upper electrode is formed to have a shape of a 2n-fold rotationally symmetric body having 2n beams extending from a central part of the upper electrode, wherein n is a natural number, and
in the shaping of the first conductive material layer, the lower electrode is formed in advance so that an area of the lower electrode overlapping the upper electrode becomes a 2n-fold rotationally symmetric body in a plan view of the substrate after performing the shaping of the second conductive material layer.

5. An oscillator comprising: the vibrator according to claim 1.

6. An electronic apparatus comprising: the vibrator according to claim 1.

7. A moving object comprising: the vibrator according to claim 1.

* * * * *